(12) United States Patent
Chen et al.

(10) Patent No.: US 12,367,569 B2
(45) Date of Patent: Jul. 22, 2025

(54) AUTOMATIC OPTICAL INSPECTION SYSTEM AND METHOD

(71) Applicant: Taiwan Semiconductor Manufacturing Co., Ltd., Hsinchu (TW)

(72) Inventors: I-Hsuan Chen, Taichung (TW); Ying-Hao Wang, Tainan (TW); Chien-Lung Chen, Zhubei (TW); Chien-Chi Tzeng, Hsinchu (TW); Hu-Wei Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 603 days.

(21) Appl. No.: 17/730,585

(22) Filed: Apr. 27, 2022

(65) Prior Publication Data

US 2023/0351577 A1 Nov. 2, 2023

(51) Int. Cl.
*G06T 7/00* (2017.01)
*G01N 1/44* (2006.01)
*G01N 21/95* (2006.01)
*G01N 35/00* (2006.01)
*G06T 7/70* (2017.01)
(Continued)

(52) U.S. Cl.
CPC .............. *G06T 7/0004* (2013.01); *G01N 1/44* (2013.01); *G01N 21/9501* (2013.01); *G01N 35/00* (2013.01); *G06T 7/70* (2017.01); *H01L 22/12* (2013.01); *H04N 25/71* (2023.01); *G01N 2035/00346* (2013.01); *G06T 2207/30148* (2013.01)

(58) Field of Classification Search
CPC ..................... G06T 7/0004; G06T 7/70; G06T 2207/30148; G06T 7/74; G06T 7/001; G01N 1/44; G01N 21/9501; G01N 35/00; G01N 2035/00346; H01L 22/12; H01L 21/76898; H04N 25/71
See application file for complete search history.

(56) References Cited

U.S. PATENT DOCUMENTS

2008/0237817 A1* 10/2008 Pendse .................... H01L 23/40
257/E23.031
2014/0043033 A1* 2/2014 Butters .............. G01R 31/2656
324/501

(Continued)

*Primary Examiner* — S M Sohel Imtiaz
(74) *Attorney, Agent, or Firm* — Slater Matsil, LLP

(57) ABSTRACT

A method includes forming a package component, the package component comprising an integrated circuit die, attaching the package component to a package substrate; placing a heat spreader over the package component and the package substrate to form an integrated circuit package, wherein a height of the integrated circuit package is in a range from 2.5 mm to 6 mm, and performing a first automatic optical inspection (AOI) process on the integrated circuit package using an AOI apparatus to determine if the orientation and alignment of the heat spreader with regards to the package substrate is within specification, wherein the AOI apparatus comprises a lens that has a maximum depth of field that is greater than the height of the integrated circuit package, and wherein during the first AOI process the depth of field encompasses an entirety of the height of the integrated circuit package.

20 Claims, 22 Drawing Sheets

(51) Int. Cl.
*H01L 21/66* (2006.01)
*H04N 25/71* (2023.01)

(56) References Cited

U.S. PATENT DOCUMENTS

| | | | |
|---|---|---|---|
| 2015/0069635 A1* | 3/2015 | Kim | H01L 25/0657 438/109 |
| 2015/0084178 A1* | 3/2015 | Kim | H01L 25/065 257/706 |
| 2018/0042100 A1* | 2/2018 | Kang | H05K 7/20509 |
| 2019/0287237 A1* | 9/2019 | de Bonfim Gripp | G06T 7/64 |
| 2021/0289633 A1* | 9/2021 | Hatch | H05K 3/1283 |

* cited by examiner

AUTOMATIC OPTICAL INSPECTION SYSTEM AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. Automatic Optical Inspection (AOI) systems may be used to inspect various aspects and features of articles during package manufacture or assembly thereof, such as but not limited to, conductor integrity (breaks, continuity, cracking, etc.) and dimensions, insulator or substrate integrity and dimensions, hole size and placement, heat spreader size and placement, via size and placement, conductor pitch, line widths and lengths, artwork features, paste, component placement, solder joint defects and so forth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-11A are views of intermediate stages in the manufacturing of integrated circuit packages, in accordance with some embodiments.

DETAILED DESCRIPTION

Figure 1:
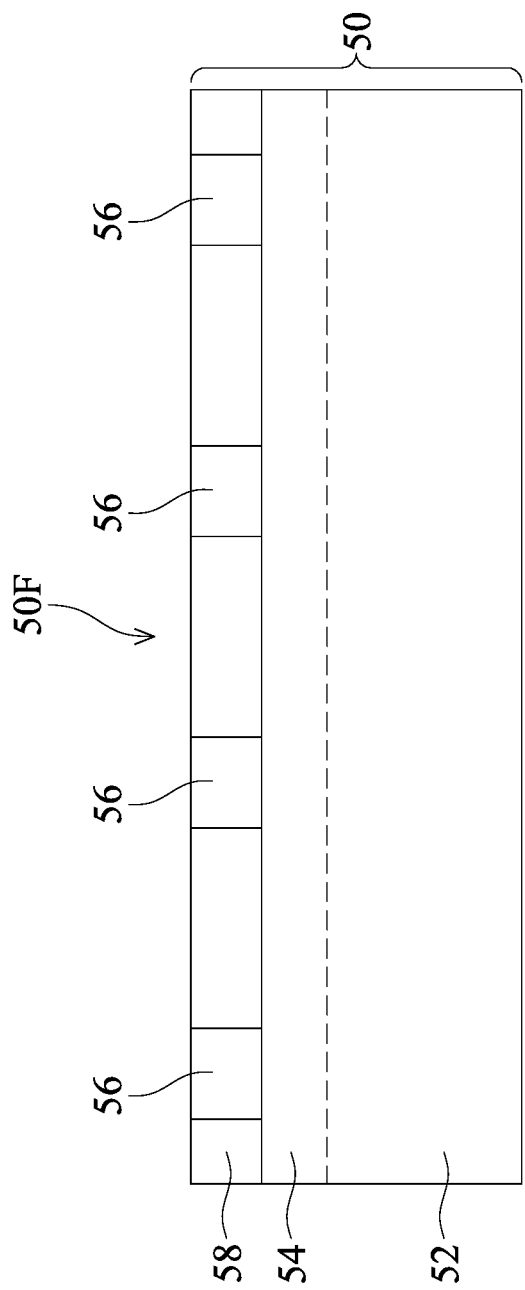
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a system and method for automatic optical inspection (AOI) of integrated circuit packages. Each integrated circuit package comprises a die placed on a substrate using a die-attach process. A seal adhesive is dispensed on a periphery of the substrate, for example, for attaching a lid. A thermal interface material (TIM) is applied to a top surface of the die and the lid is thereafter placed on the substrate, making contact with the seal adhesive and the die by way of the TIM. An AOI process is then carried out to determine if the orientation and alignment of the lid with regards to the underlying substrate is within specification or whether the placement of the lid needs to be repeated (also referred to as reworked). Although the AOI system is described as being used to inspect an integrated circuit package that comprises a lid, the AOI system may be used to inspect any aspect or feature of a package or structure during manufacture or assembly thereof. The AOI system may comprise a charge-coupled device (CCD) camera, as well as a lens with a specific aperture that has an f-stop number that is equal to or greater than 8. In addition, the lens may have a magnification that is equal to or greater than 0.4. Advantageous features of embodiments disclosed herein include better image focus, a greater working distance and an improved depth of field (DOF) during the AOI process which allows for different integrated circuit packages having different heights to remain in focus without having to adjust a vertical height of the lens or the CCD camera. In addition, there is a reduction in the number of false lid offset alarms during the AOI process as edges of features of the integrated circuit packages as easier to detect. The reduction in false lid offset alarms and the removal of the need to adjust the lens height for different integrated circuit packages having different heights leads to increased throughput and higher manufacturing efficiency.

FIG. 1 is a cross-sectional view of an integrated circuit die 50. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations) such that they are level with one another. The die connectors 56 and the dielectric layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 54.

FIGS. 2-11A are views of intermediate stages in the manufacturing of integrated circuit packages 200, in accordance with some embodiments. FIGS. 2-11A are cross-sectional views of a process for forming package components 210 which include redistribution structures for fanning out electrical connections, such as Integrated Fan-Out (InFO) package components. In the illustrated embodiments, the InFO package components include two layers of encapsulated dies. In other embodiments, the InFO package components have other quantities of layers, such as one layer or more than two layers.

Figure 2:
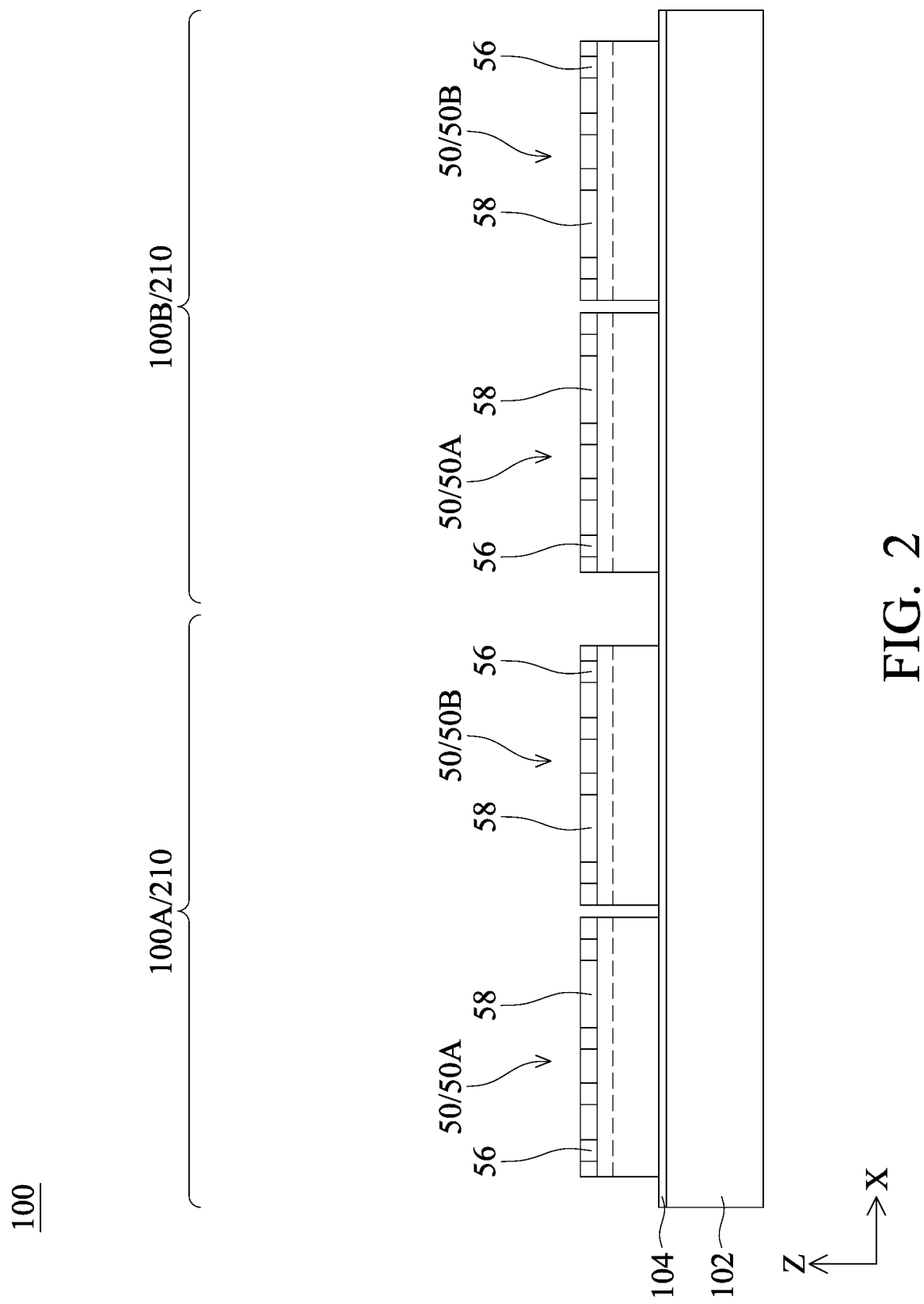

The integrated circuit packages 200 (see FIG. 11A) will be formed by initially packaging integrated circuit dies 50 to form package components 210 in a wafer 100. Two package regions 100A, 100B of the wafer 100 are illustrated in FIG. 2, and integrated circuit dies 50 are packaged to form a package component 210 in each of the package regions 100A, 100B of the wafer 100. It should be appreciated that any quantity of package regions can be simultaneously processed to form any quantity of package components. The package regions 100A, 100B of the wafer 100 will be singulated to form the package components 210. The package components 210 will then be attached to package substrates 220 (see FIG. 10) to complete formation of the integrated circuit packages 200.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be planarized and may have a high degree of planarity.

Semiconductor dies such as integrated circuit dies 50 are placed on the release layer 104. A desired type and quantity of the integrated circuit dies 50 are placed in each of the package regions 100A. 100B of the wafer 100. The integrated circuit dies 50 may be placed by, e.g., a pick-and-place process. In the illustrated embodiment, multiple integrated circuit dies 50 (including a first integrated circuit die 50A and a second integrated circuit die 50B) are placed adjacent one another in each of the package regions 100A, 100B of the wafer 100. In some embodiments, the first integrated circuit dies 50A are logic devices, such as CPUs, GPUs, or the like, and the second integrated circuit dies 50B are memory devices, such as DRAM dies, HMC modules, HBM modules, or the like. In some embodiments, the first integrated circuit dies 50A are the same type of devices (e.g., SoCs) as the second integrated circuit dies 50B. The first integrated circuit dies 50A may be formed in a process of a same technology node as the second integrated circuit dies 50B, or may be formed in a process of a different technology node than the second integrated circuit dies 50B. For example, the first integrated circuit dies 50A may be of a more advanced process node than the second integrated circuit dies 50B. The first integrated circuit dies 50A may have a different size (e.g., different height and/or surface area) than the second integrated circuit dies 50B, or may have the same size (e.g., same heights and/or surface areas) as the second integrated circuit dies 50B.

Figure 3:
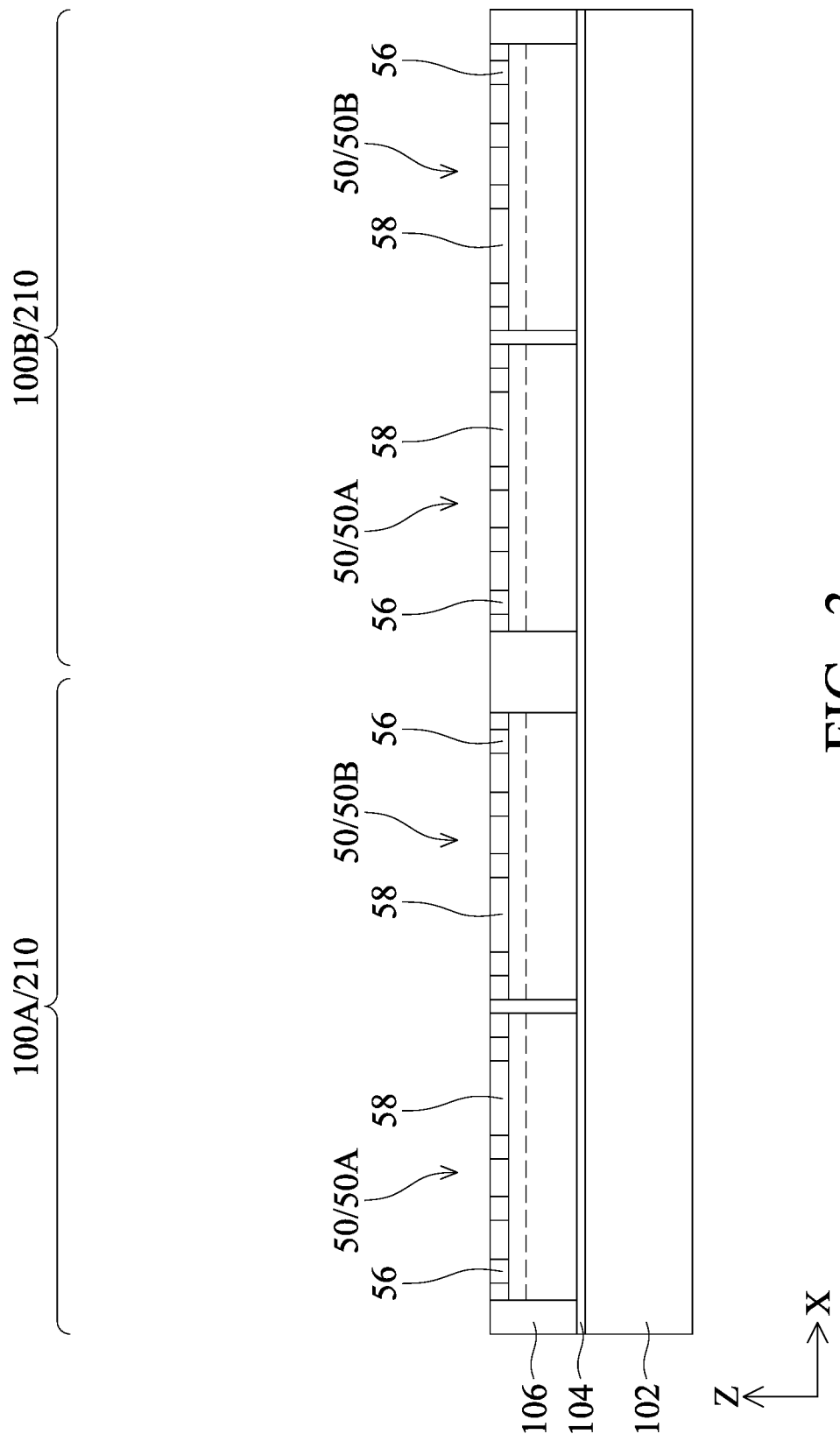

In FIG. 3, an encapsulant 106 is formed around the integrated circuit dies 50 and on the release layer 104. After formation, the encapsulant 106 encapsulates the integrated circuit dies 50. The encapsulant 106 may be a molding compound, epoxy, or the like. In some embodiments, the encapsulant 106 includes a polymer resin having fillers disposed therein. The encapsulant 106 may be applied by compression molding, transfer molding, or the like, and may be dispensed over the carrier substrate 102 such that the integrated circuit dies 50 are buried or covered. The encapsulant 106 is further dispensed in gap regions between the integrated circuit dies 50. The encapsulant 106 may be applied in liquid or semi-liquid form and then subsequently cured. A planarization process may be performed on the encapsulant 106 to expose the die connectors 56 of the integrated circuit dies 50. The planarization process may remove material of the encapsulant 106 and the integrated circuit dies 50 (e.g., the die connectors 56 and the dielectric layer 58) until the die connectors 56 are exposed. After the planarization process, top surfaces of the encapsulant 106 and the integrated circuit dies 50 (e.g., the die connectors 56 and the dielectric layer 58) are substantially coplanar (within process variations) such that they are level with one another. The planarization process may be, for example, a chemical-mechanical polish (CMP), a grinding process, or the like. In some embodiments, the planarization process may be omitted, for example, if the die connectors 56 are already exposed.

Figure 4:
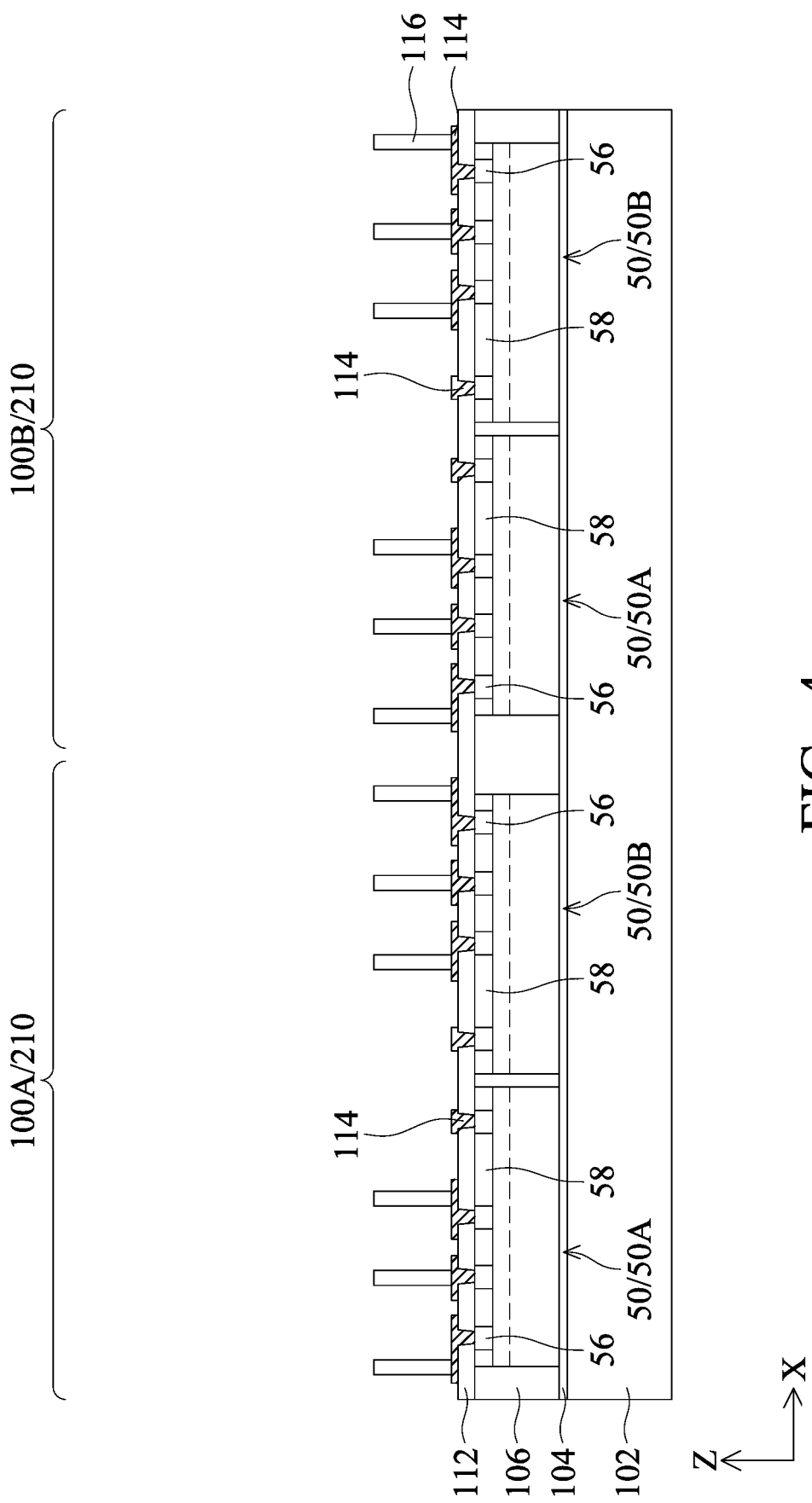

In FIG. 4, a dielectric layer 112 is deposited on the encapsulant 106 and the integrated circuit dies 50 (e.g., on the die connectors 56 and the dielectric layer 58). The dielectric layer 112 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, CVD, or the like. Other acceptable dielectric materials formed by any acceptable process may be used. The dielectric layer 112 is then patterned. The patterning forms openings (not separately illustrated) in the dielectric layer 112 exposing portions of the die connectors 56. The patterning may be performed by any acceptable process, such as by exposing the dielectric layer 112 to light and developing it when the dielectric layer 112 is a photosensitive material, or by etching using, for example, an anisotropic etch.

Under-bump metallurgy layers (UBMLs) 114 are then formed. The UBMLs 114 have line portions on and extending along the top surface of the dielectric layer 112, and have via portions extending through the dielectric layer 112 to physically and electrically couple the UBMLs 114 to the die connectors 56 of the integrated circuit dies 50. As an example to form the UBMLs 114, a seed layer is formed over the dielectric layer 112 and in the openings through the dielectric layer 112. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMLs 114. The patterning forms openings through the photoresist to expose the seed layer. A conductive material is then formed in the openings of the photoresist and on the exposed portions of the seed layer. The conductive material may be a metal such as copper, titanium, tungsten, aluminum, or the like, which may be formed by plating, such as electroless plating or electroplating from the seed layer, or the like. The photoresist may be removed by any acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and the conductive material form the UBMLs 114.

Through vias 116 are formed on the line portions of the UBMLs 114, with some of the UBMLs 114 remaining free of the through vias 116. The through vias 116 and the UBMLs 114 will be used for connection to upper layers of the package components 210. In some embodiments, the through vias 116 are formed of the same conductive material as the UBMLs 114, such that the through vias 116 and the UBMLs 114 comprise the same continuous conductive material. As an example to form the through vias 116, a photoresist is formed and patterned on the UBMLs 114. The photoresist may be formed by spin coating or the like and may be exposed to light for patterning. The pattern of the photoresist corresponds to the through vias 116. A conductive material is then formed in the openings of the photoresist. In some embodiments, additional portions of the conductive material of the UBMLs 114 are formed in the openings of the photoresist. The additional portions of the conductive material of the UBMLs 114 may be formed by plating, such as electroless plating or electroplating from the original portions of the conductive material that were plated from the seed layer of the UBMLs 114, or the like. In some embodiments, no seed layers are formed between the conductive material of the UBMLs 114 and the through vias 116, so that the conductive material is a single continuous material layer. The photoresist is then removed. The photoresist may be removed by any acceptable ashing or stripping process, such as using an oxygen plasma or the like. The remaining portions of the conductive material forms the through vias 116.

Figure 5:
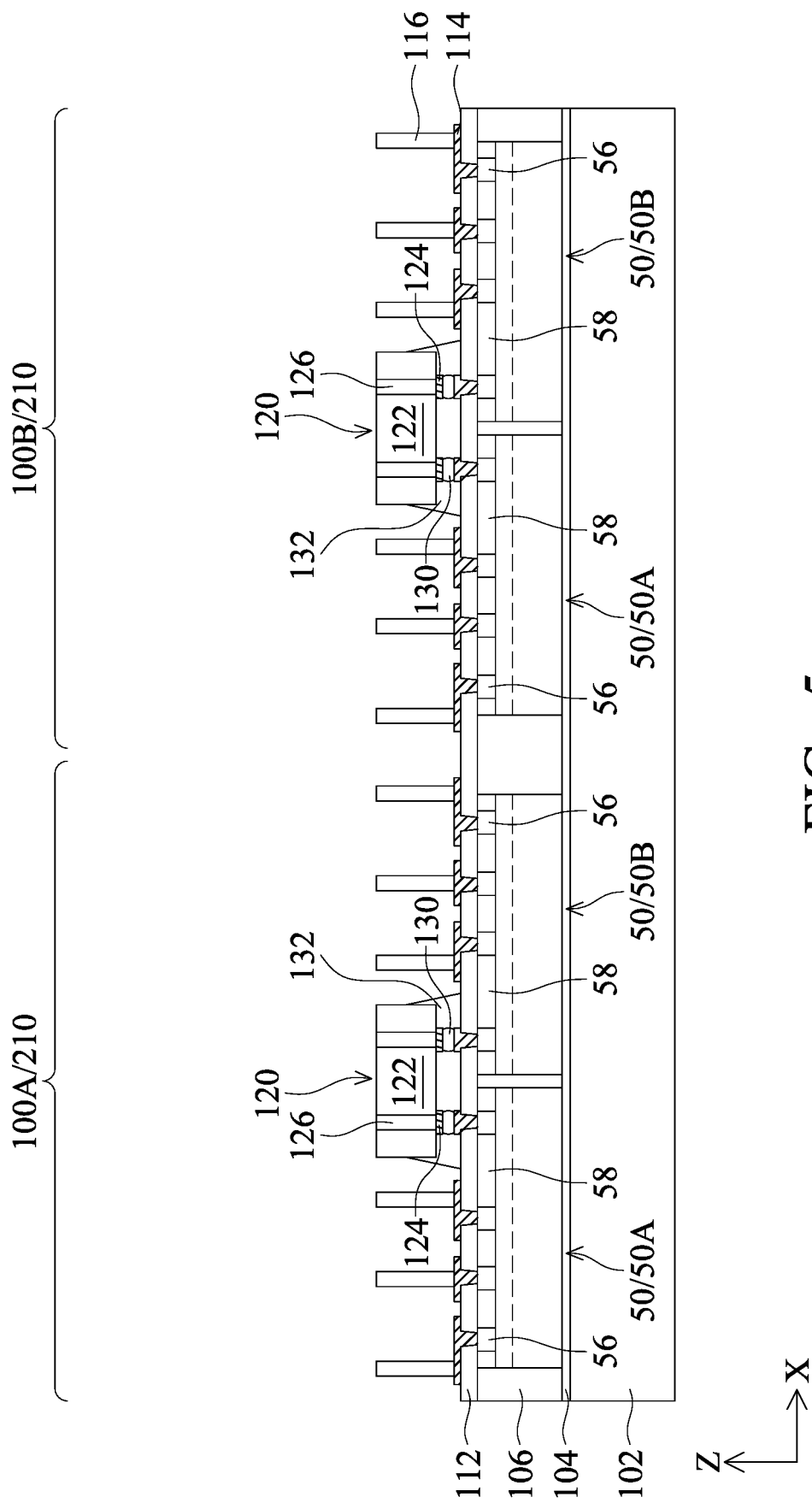

In FIG. 5, semiconductor dies such as interconnection dies 120 are attached to the UBMLs 114. A desired type and quantity of the interconnection dies 120 are placed in each of the package regions 100A, 100B of the wafer 100. The interconnection dies 120 may be local silicon interconnects (LSIs), large scale integration packages, interposer dies, or the like. Each interconnection die 120 includes a substrate 122, with conductive features formed in and/or on the substrate 122. The substrates 122 may be semiconductor substrates, dielectric layers, or the like. The interconnection dies 120 are connected to the UBMLs 114 using die connectors 124 disposed at the front-side of the interconnection dies 120. Some of the die connectors 124 may be electrically coupled to the back-side of the interconnection dies 120 with through-substrate vias (TSVs) 126 that extend into or through the substrates 122. In the illustrated embodiment, the TSVs 126 extend through the substrates 122 so that they are exposed at the back-sides of the interconnection dies 120. In another embodiment, a material of the substrates 122 (e.g., a dielectric material or semiconductor material) may be covering the TSVs 126. In some embodiments, passive devices (e.g., integrated passive devices) and/or other integrated circuit dies are attached to the UBMLs 114 in addition to or in lieu of the interconnection dies 120.

In some embodiments where the interconnection dies 120 are LSIs, the interconnection dies 120 may be bridge structures that include die bridges (not separately illustrated). The die bridges may be metallization layers formed in and/or on the substrates 122, and work to interconnect some of the die connectors 124 to one another. As such, the LSIs can be used to directly connect and allow communication between the integrated circuit dies 50 in each package region 100A, 100B of the wafer 100. In such embodiments, each interconnection die 120 can be placed over a region that is disposed between the underlying integrated circuit dies 50 so that the interconnection die 120 overlaps the underlying integrated circuit dies 50. In some embodiments, the interconnection dies 120 may further include logic devices and/or memory devices.

Conductive connectors 130 are formed on the die connectors 124 and/or some of the UBMLs 114. The conductive connectors 130 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 130 may include a conductive material such as solder, copper, aluminum, gold, nickel, silver, palladium, tin, the like, or a combination thereof. In some embodiments, the conductive connectors 130 are formed by initially forming a layer of solder on the die connectors 124 and/or the UBMLs 114 through evaporation, electroplating, printing, solder transfer, ball placement, or the like. Once a layer of solder has been formed on the structure, a reflow may be performed in order to shape the material into the desired bump shapes. The interconnection dies 120 are connected to the UBMLs 114 using the conductive connectors 130. Connecting the interconnection dies 120 may include placing the interconnection dies 120 on the UBMLs 114, and reflowing the conductive connectors 130 to physically and electrically couple the die connectors 124 to the underlying UBMLs 114.

In some embodiments, an underfill 132 is formed around the conductive connectors 130, and between the dielectric layer 112 and the interconnection dies 120. The underfill 132 may reduce stress and protect the joints resulting from the reflowing of the conductive connectors 130. The underfill 132 may also be included to adhere the interconnection dies 120 to the dielectric layer 112 and provide structural support and environmental protection. The underfill 132 may be formed of a molding compound, an epoxy, or the like. The underfill 132 may be formed by a capillary flow process after the interconnection dies 120 are attached, or may be formed by any suitable deposition method before the interconnection dies 120 are attached. The underfill 132 may be applied in liquid or semi-liquid form and then subsequently cured.

Figure 6:
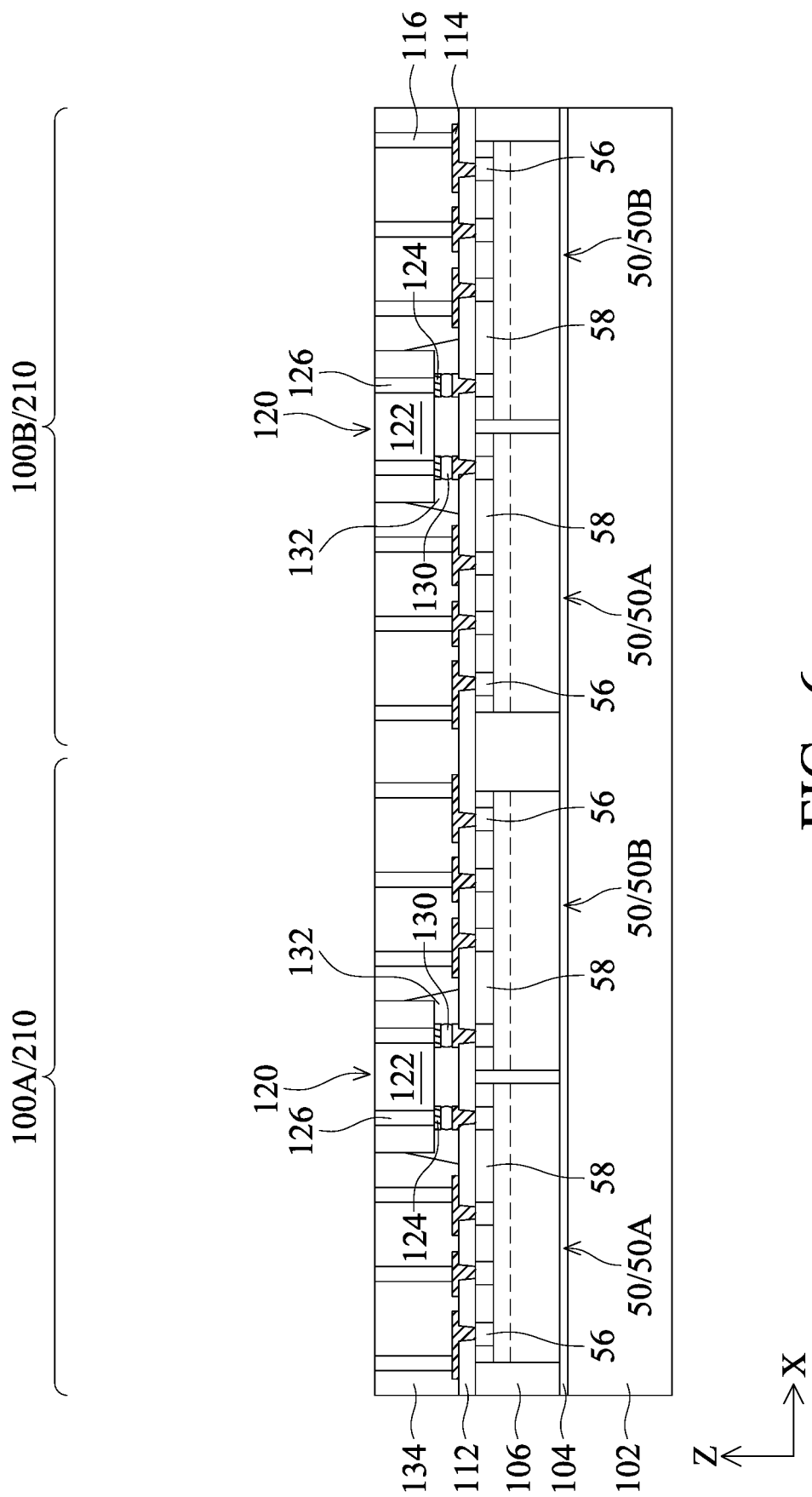

In FIG. 6, an encapsulant 134 is formed around the UBMLs 114, the through vias 116, the interconnection dies 120, and the underfill 132 (if present) or the conductive connectors 130. After formation, the encapsulant 134 encapsulates the UBMLs 114, the through vias 116, the interconnection dies 120, and the underfill 132 (if present) or the conductive connectors 130. The encapsulant 134 may be a molding compound, epoxy, or the like. In some embodiments, the encapsulant 134 includes a polymer resin having fillers disposed therein. The encapsulant 134 may be applied by compression molding, transfer molding, or the like, and may be dispensed such that the interconnection dies 120 and the through vias 116 are buried or covered. The encapsulant 134 is further dispensed in gap regions between the interconnection dies 120 and the through vias 116. The encapsulant 134 may be applied in liquid or semi-liquid form and then subsequently cured. A planarization process may be performed on the encapsulant 134 to expose the TSVs 126 and the through vias 116. The planarization process may remove material of the encapsulant 134, the TSVs 126, the substrates 122, and the through vias 116 until the TSVs 126 and the through vias 116 are exposed. After the planarization process, top surfaces of the encapsulant 134, the TSVs 126, the substrates 122, and the through vias 116 are substantially coplanar (within process variations) such that they are level with one another. The planarization process may be. for example, a chemical-mechanical polish (CMP), a grinding process, or the like. In some embodiments, the planarization process may be omitted, for example, if the TSVs 126 and the through vias 116 are already exposed.

Figure 7:
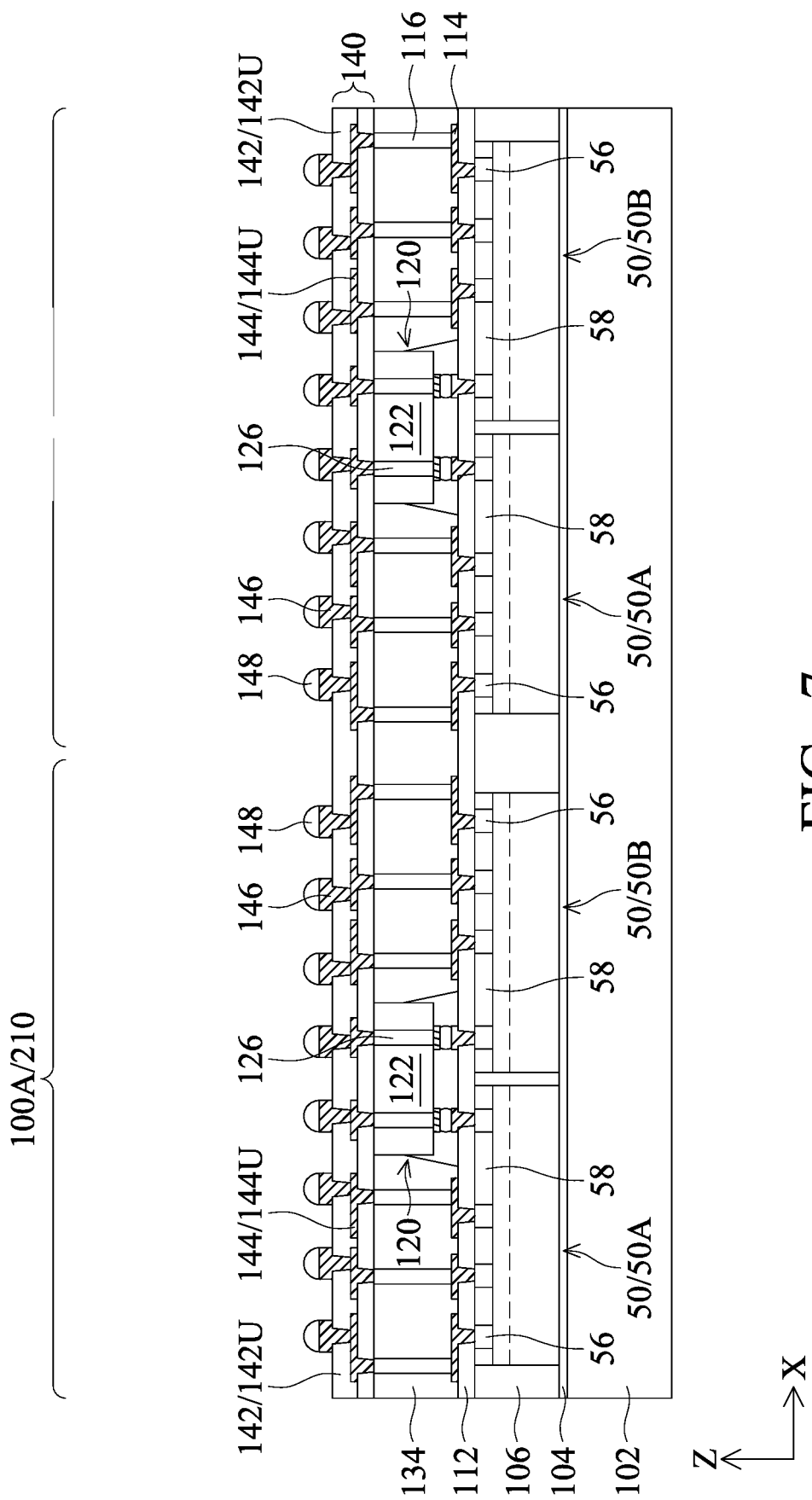

In FIG. 7, a redistribution structure 140 is formed on the top surfaces of the encapsulant 134, the interconnection dies 120 (e.g., the substrates 122 and the TSVs 126), and the through vias 116. The redistribution structure 140 includes dielectric layers 142 and metallization layers 144 (sometimes referred to as redistribution layers or redistribution lines) among the dielectric layers 142. For example, the redistribution structure 140 may include a plurality of metallization layers 144 separated from each other by respective dielectric layers 142. The metallization layers 144 of the redistribution structure 140 are connected to the through vias 116 and the interconnection dies 120 (e.g., the TSVs 126). Specifically, the metallization layers 144 are connected to the integrated circuit dies 50 by the TSVs 126 and/or the through vias 116.

In some embodiments, the dielectric layers 142 are formed of a polymer, which may be a photo-sensitive material such as PBO, polyimide, a BCB-based polymer, or the like, and may be patterned using a lithography mask. In other embodiments, the dielectric layers 142 are formed of a nitride such as silicon nitride; an oxide such as silicon oxide, PSG, BSG, BPSG; or the like. The dielectric layers 142 may be formed by spin coating, lamination, CVD, the like, or a combination thereof. After each dielectric layer 142 is formed, it is then patterned to expose underlying conductive features, such as portions of underlying through vias 116, TSVs 126, or metallization layers 144. The patterning may be by any acceptable process, such as by exposing the dielectrics layers to light when the dielectric layers 142 are a photo-sensitive material, or by etching using, for example, an anisotropic etch. In embodiments where the dielectric layers 142 are photo-sensitive materials, the dielectric layers 142 can be developed after the exposure.

The metallization layers 144 each include conductive vias and/or conductive lines. The conductive vias extend through a respective dielectric layer 142, and the conductive lines extend along the respective dielectric layer 142. As an example to form a metallization layer 144, a seed layer (not separately illustrated) is formed over the respective underlying features. For example, the seed layer can be formed on a respective dielectric layer 142 and in the openings through the respective dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by any acceptable ashing or stripping process, such as using an oxygen plasma or the like. Once the photoresist is removed, exposed portions of the seed layer are removed, such as by using any acceptable etching process, such as by wet or dry etching. The remaining portions of the seed layer and conductive material form the metallization layer 144.

The redistribution structure 140 is illustrated as an example. More or fewer dielectric layers 142 and metallization layers 144 than illustrated may be formed in the redistribution structure 140 by repeating or omitting the steps previously described.

Under-bump metallizations (UBMs) 146 are formed for external connection to the redistribution structure 140. The UBMs 146 have bump portions on and extending along the top surface of the upper dielectric layer 142U of the redistribution structure 140, and have via portions extending through the upper dielectric layer 142U of the redistribution structure 140 to physically and electrically couple the upper metallization layer 144U of the redistribution structure 140. As a result, the UBMs 146 are electrically connected to the through vias 116 and the interconnection dies 120 (e.g., the TSVs 126). The UBMs 146 may be formed of the same material as the metallization layers 144, and may be formed by a similar process as the metallization layers 144. In some embodiments, the UBMs 146 have a different size (such as a greater size) than the metallization layers 144.

Conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 148 are disposed at the front-sides of the package components 210.

Figure 8:
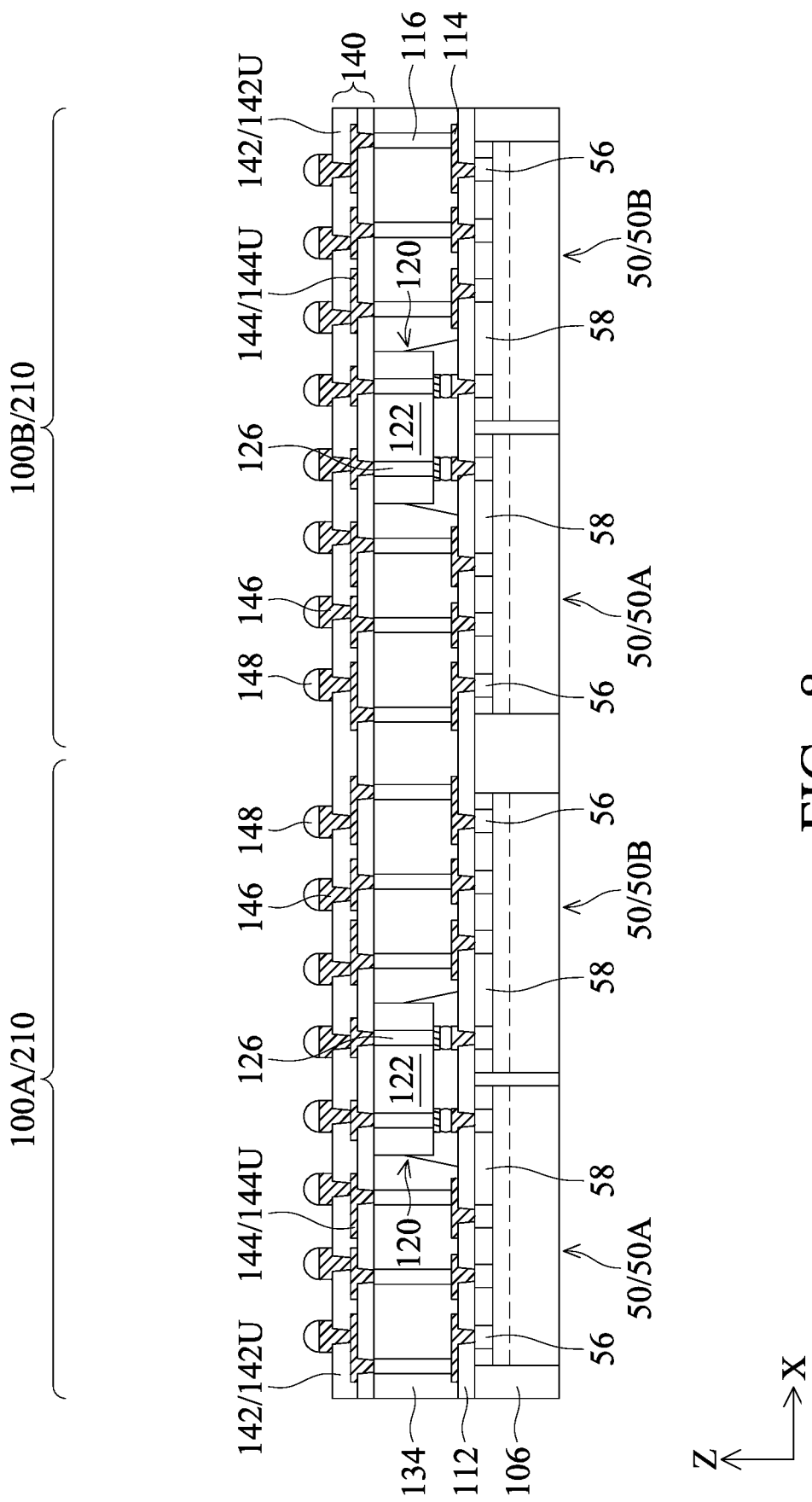

In FIG. 8, a carrier substrate debonding process is performed to detach (or "debond") the carrier substrate 102 from the integrated circuit dies 50 and the encapsulant 106. After the carrier substrate 102 is removed, the integrated circuit dies 50 and the encapsulant 106 are exposed at the back-sides of the package components 210. In some embodiments, the debonding process includes projecting a light such as a laser light or an UV light on the release layer 104 so that the release layer 104 decomposes under the heat of the light and the carrier substrate 102 can be removed. A cleaning process may optionally be performed to remove residue of the release layer 104. The structure is then flipped over and placed on any acceptable support structure (not separately illustrate), such as tape or a frame.

Figure 9:
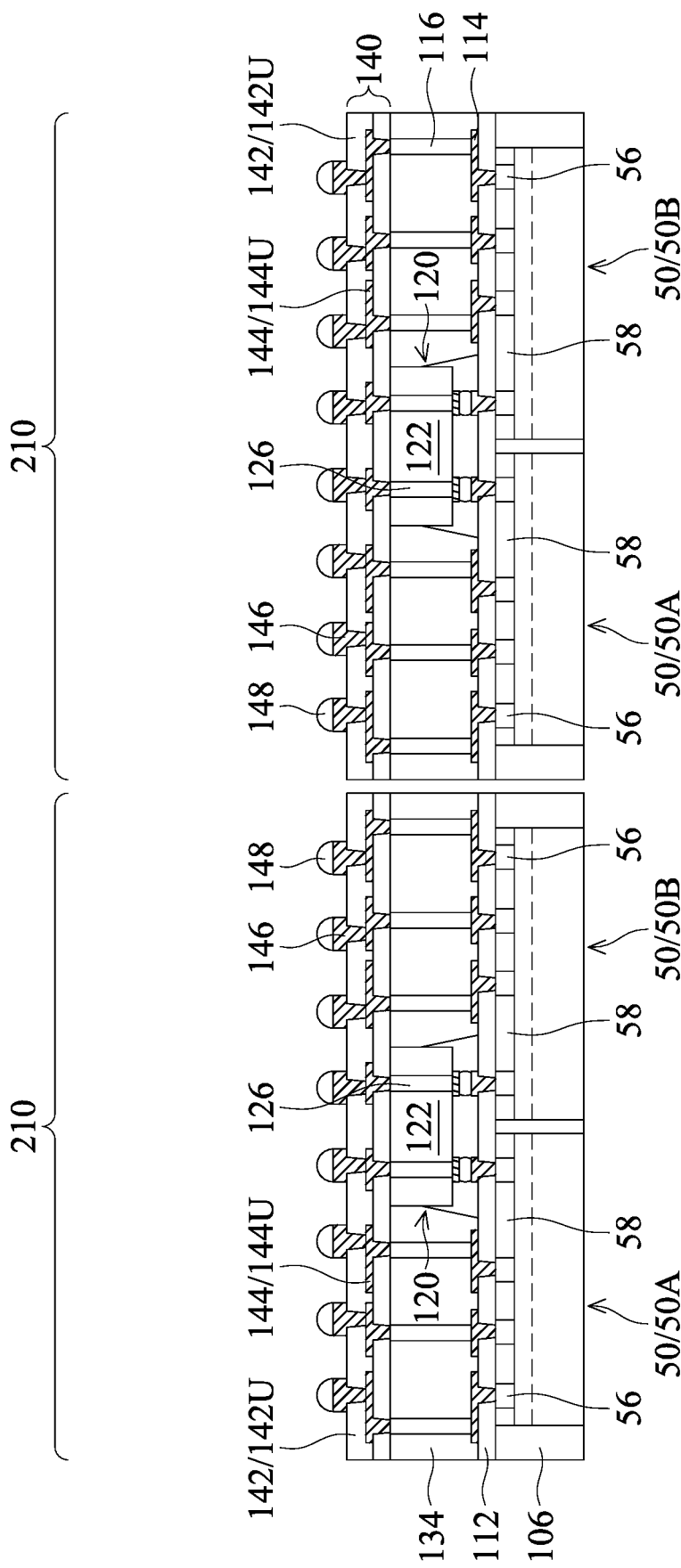

In FIG. 9, a singulation process is performed along scribe line regions, e.g., between the package regions 100A, 100B of the wafer 100. The singulation process may be a sawing process, a laser cutting process, or the like. The singulation process singulates the package regions 100A, 100B of the wafer 100 from each other. The resulting, singulated package components 210 are from the package regions 100A, 100B of the wafer 100.

Figure 10:
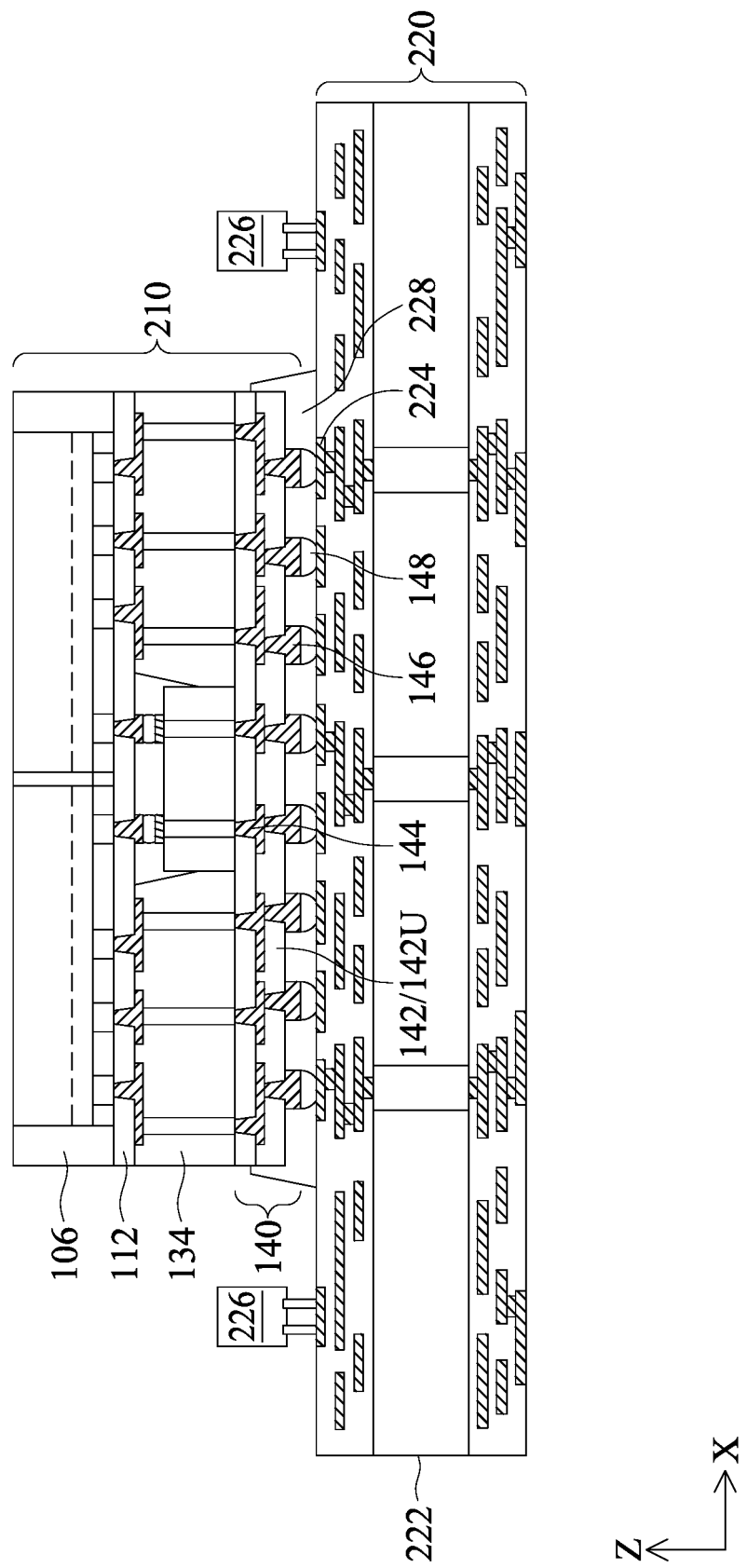
Figure 11A:
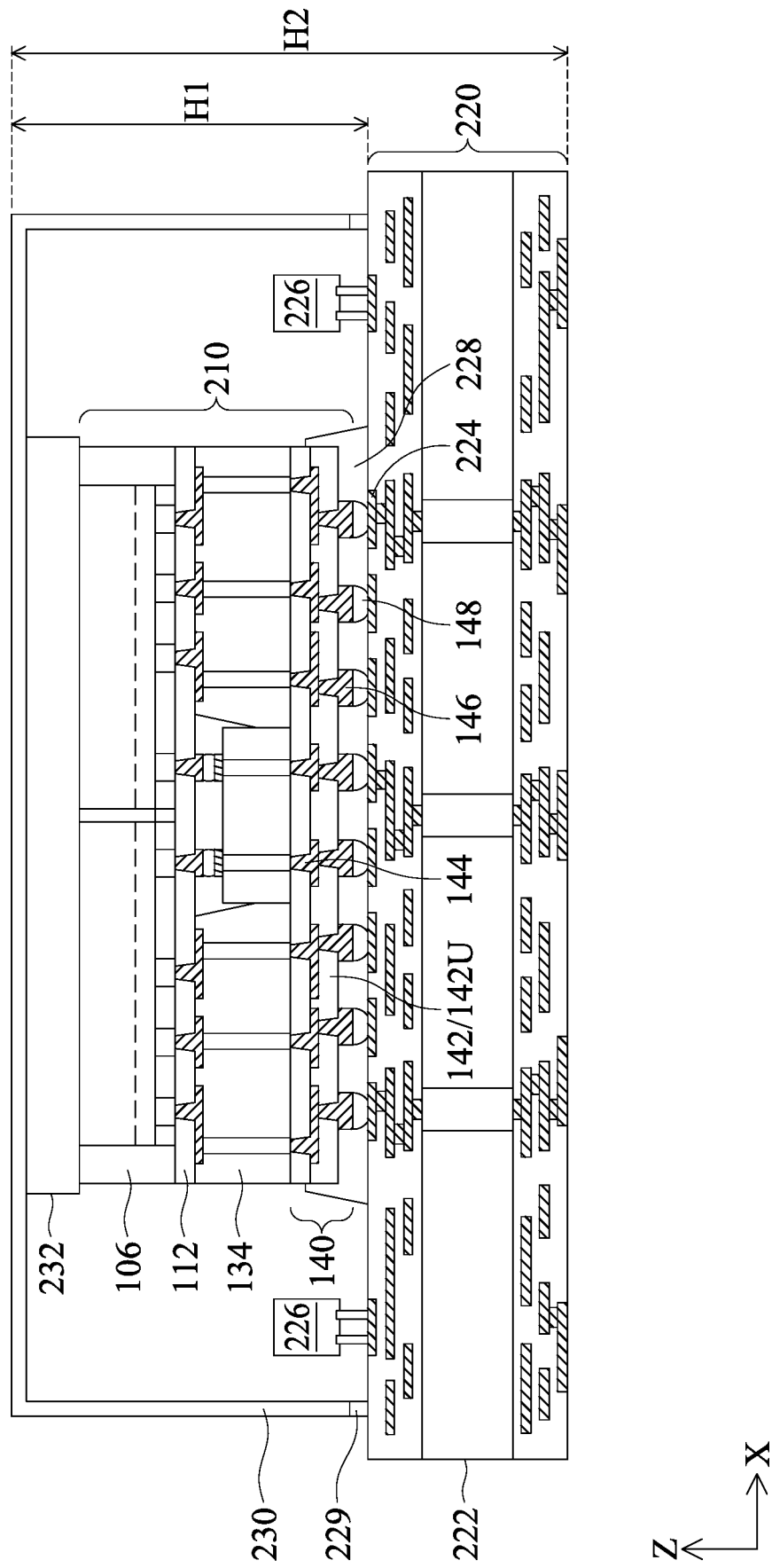

FIGS. 10-11A illustrate various additional steps in the manufacturing of embodiment packages. The package components 210 will be attached to package substrates 220 (see FIG. 11A), thus completing formation of the integrated circuit packages 200. A single package component 210, a single package substrate 220, and a single integrated circuit package 200 are illustrated. It should be appreciated that multiple package components can be simultaneously processed to form multiple integrated circuit packages 200.

In FIG. 10, a package component 210 is attached to a package substrate 220 using the conductive connectors 148. The package substrate 220 includes a substrate core 222, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 222 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 222 may also include metallization layers and vias, and bond pads 224 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core 222 is substantially free of active and passive devices.

The conductive connectors 148 are reflowed to attach the UBMs 146 to the bond pads 224. The conductive connectors 148 connect the package component 210, including the metallization layers 144 of the redistribution structure 140, to the package substrate 220, including metallization layers of the substrate core 222. Thus, the package substrate 220 is electrically connected to the integrated circuit dies 50. In some embodiments, passive devices (e.g., surface mount devices (SMDs), not separately illustrated) may be attached to the package component 210 (e.g., bonded to the UBMs 146) prior to mounting on the package substrate 220. In such embodiments, the passive devices may be bonded to a same surface of the package component 210 as the conductive connectors 148. In some embodiments, passive devices 226 (e.g., SMDs) may be attached to the package substrate 220, e.g., to the bond pads 224.

In some embodiments, an underfill 228 is formed between the package component 210 and the package substrate 220, surrounding the conductive connectors 148. The underfill 228 may be formed by a capillary flow process after the package component 210 is attached or may be formed by any suitable deposition method before the package component 210 is attached. The underfill 228 may be a continuous material extending from the package substrate 220 to the redistribution structure 140 (e.g., to the upper dielectric layer 142U). In this embodiment, the underfill 228 physically contacts the portions of the heat dissipation structure 212 which extend along the top surface of the upper dielectric layer 142U. The underfill 228 may also physically contact the projecting portions 212P of the heat dissipation structure 212 (if present).

In FIG. 11A, an adhesive material 229 is dispensed on the package substrate 220. The adhesive material 229 may comprise any material suitable for sealing a heat spreader 230 (e.g., a thermal lid or thermal ring) onto the package substrate 220, such as epoxies, urethane, polyurethane, silicone elastomers, and the like. The adhesive material 229 may be dispensed to an outer portion or a periphery or edges of the package substrate 220. Following application of the adhesive material 229 to the package substrate 220, a thermal interface material (TIM) 232 is applied to the top of the package component 210. The TIM 232 may include but is not limited to, thermal grease, phase change material, metal filled polymer matrix, and solder alloys of lead, tin, indium, silver, copper, bismuth, and the like (most preferred is indium or lead/tin alloy). If the TIM 232 is a solid, it may be heated to a temperature at which it undergoes a solid to liquid transition and then may be applied in liquid form to the top surface of the package component 210.

Further referring to FIG. 11A, a heat spreader 230 is placed on the package substrate 220. The heat spreader 230 may be a thermal lid, a thermal ring, a heatsink, or the like. A recess is in the bottom of the thermal lid or thermal ring so that the thermal lid or thermal ring can cover the package component 210. In some embodiments where the heat spreader 230 is a thermal lid or thermal ring, the thermal lid or thermal ring can also cover the passive devices 226.

The heat spreader 230 may be formed of a material with high thermal conductivity, such as a metal, such as copper, steel, iron, or the like. The heat spreader 230 protects the package component 210 and forms a thermal pathway to conduct heat from the various components of the package component 210 (e.g., the integrated circuit dies 50). In an embodiment, a height H1 of the heat spreader 230 may be in a range from 0.3 mm to 3.8 mm. In an embodiment, a height H2 of the integrated circuit package 200 may be in a range from 2.5 mm to 6 mm. The heat spreader 230 is thermally coupled to the back-side surface of the package component 210 through the TIM 232, and coupled to the package substrate 220 through the adhesive material 229.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11B:
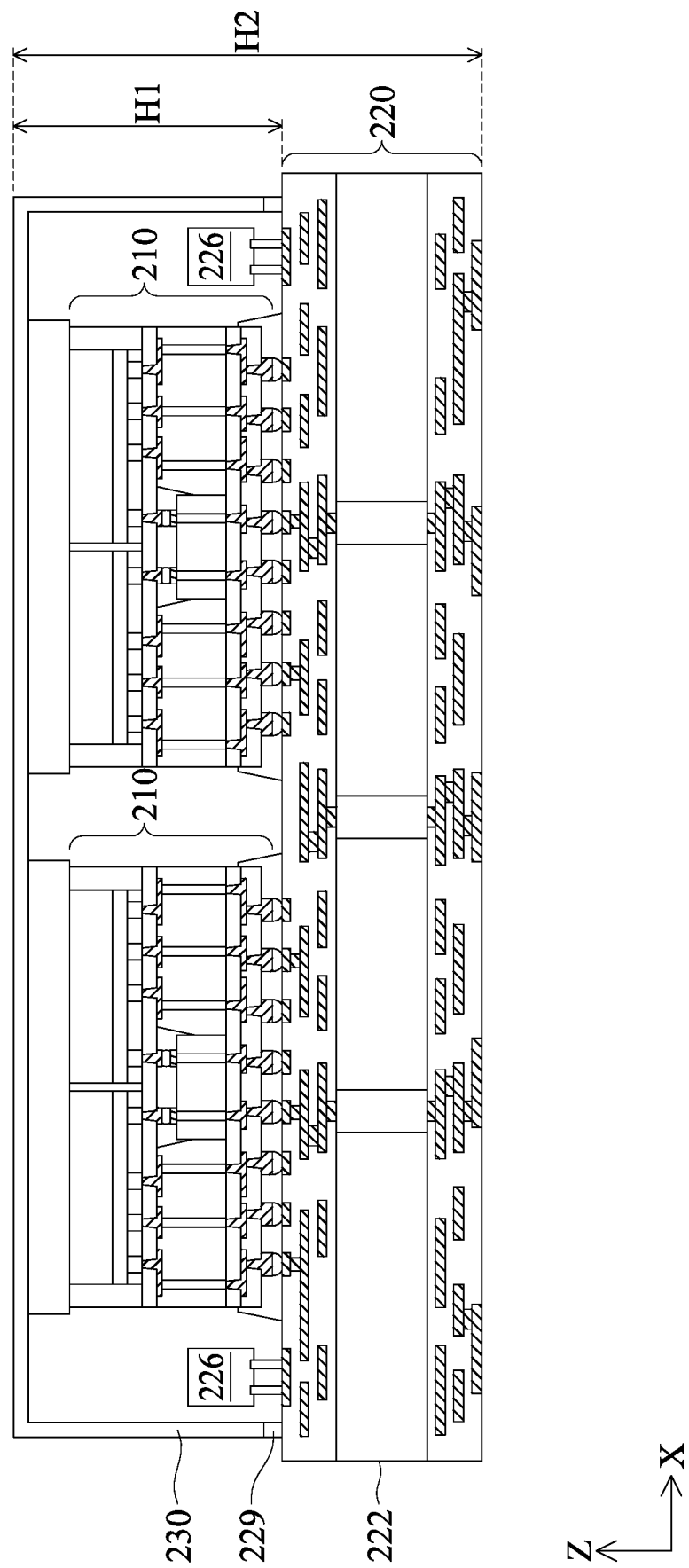
FIG. 11B is a view of an integrated circuit package, in accordance with some other embodiments.

FIG. 11B is a view of an integrated circuit package 200, in accordance with some other embodiments. This embodiment is similar to the embodiment described for FIG. 11A, except the integrated circuit package 200 includes multiple package components 210 attached to a package substrate 220. Unless specified otherwise, like reference numerals in this embodiment (and subsequently discussed embodiments)

represent like components in the embodiment shown in FIGS. 1 through 11A formed by like processes.

Figure 12B:
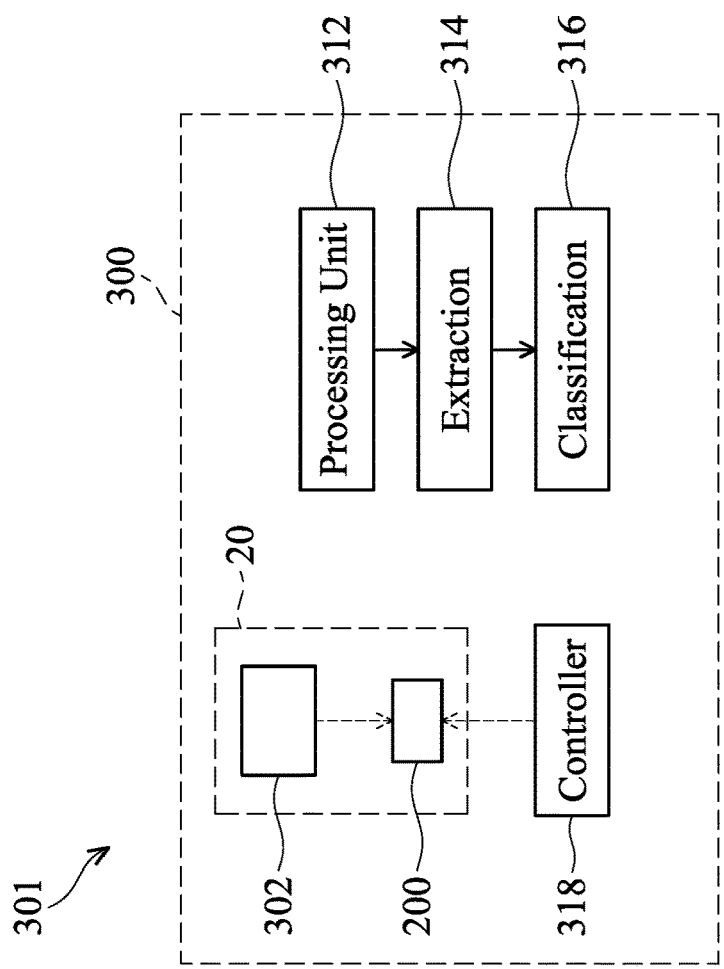
FIG. 12B illustrates a flowchart diagram for the inspection process performed by the AOI apparatus.
Figure 12A:
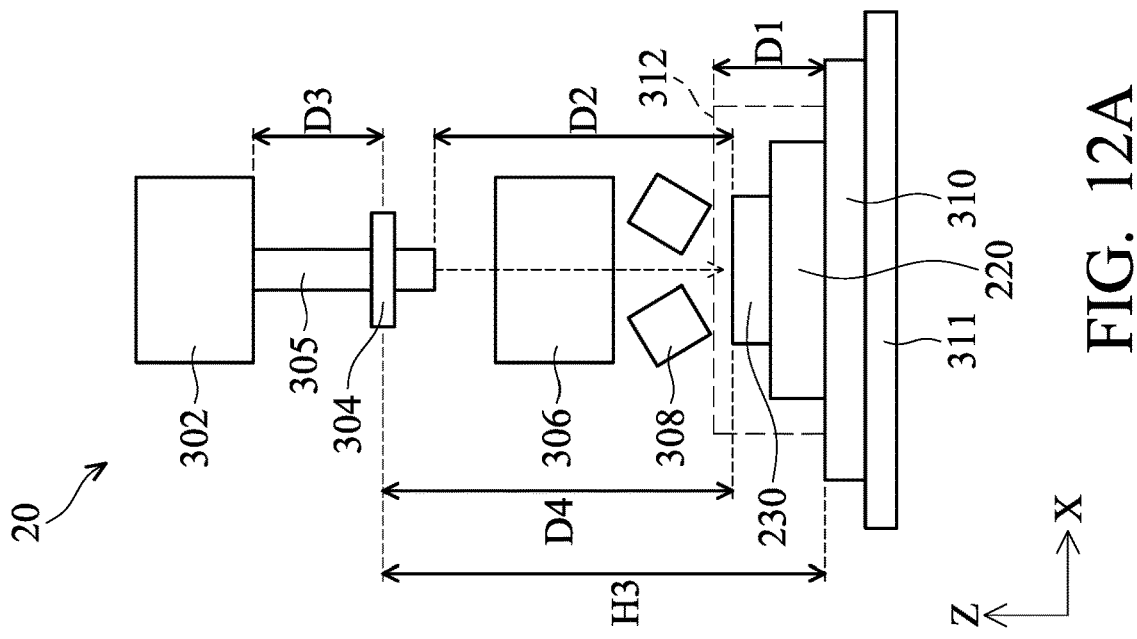
FIG. 12A illustrates an AOI apparatus that is used to perform an inspection process to inspect an integrated circuit package.

FIG. 12A illustrates an AOI apparatus 20 that is part of an AOI system 300 (shown in FIG. 12B) that is used to perform an inspection process 301 to inspect the integrated circuit package 200 and verify that the heat spreader 230 is correctly placed and aligned with regards to the underlying package substrate 220. The AOI apparatus 20 may provide the heat sink shift inspection after a lid attaching process and a hot clamp process for target packages with various thicknesses. The inspection process 301 is performed on the integrated circuit package 200 after the heat spreader 230 is placed on the package substrate 220 as shown in FIG. 11A. The AOI apparatus 20 may comprise an image acquisition and an illumination apparatus. The image acquisition apparatus may include a charge coupled device (CCD) camera 302 that converts images into digital signals. In addition, a lens 304 is mounted on the CCD camera 302 to focus light onto the CCD camera 302 image sensor. The illumination apparatus may include a coaxial light source 306 that generates and directs light at an inspected object (e.g., the integrated circuit package 200) using a half-mirror so that the lighting axis is exactly the same as the CCD camera 302 optical axis. Further illumination may be provided by four adjustable low angle lights 308 that can be used to direct light at the inspected object (e.g., the integrated circuit package 200) at different angles. In other embodiments, the AOI apparatus 20 may comprise any number of low angle lights 308.

The lens 304 may be mounted onto the CCD camera 302 body using a lens housing 305. The lens 304 may have a specific aperture (e.g., opening of the lens 304 diaphragm through which light passes). In some embodiments, the aperture may have an f-stop number that is equal to or greater than 8. In an embodiment, the aperture may have an f-stop number that is in a range from 8 to 22. This results in a larger depth of field 312 of the lens 304. The depth of field 312 is a zone of acceptable sharpness in front of and behind the inspected object (e.g., the integrated circuit package 200) on which the lens 304 is focused. In an embodiment, the depth of field 312 may have a depth D1 that is up to 6.2 mm. In some embodiments, the depth D1 may be equal to or greater than 4 mm. Because the depth of field 312 has a larger depth D1 it is able to encompass the entirety of the integrated circuit package 200 within the depth of field 312 (e.g., the depth D1 is greater than the height H2 of the of the integrated circuit package 200). As a result, the AOI apparatus 20 can sequentially inspect integrated circuit packages 200 having different heights (or having different heat spreader 230 heights), which will still remain in focus without having to adjust a vertical height (e.g., z-direction) of the lens 304 or the CCD camera 302. For example, a first integrated circuit package 200 and a second integrated circuit package 200 may be inspected sequentially using the AOI apparatus 20, where a difference in height between the first integrated circuit package 200 and the second integrated circuit package 200 is up to 3.5 mm. In some embodiments, the first integrated circuit package 200 and the second integrated circuit package 200 may be inspected sequentially using the AOI apparatus 20, where the difference in height between the first integrated circuit package 200 and the second integrated circuit package 200 is greater than 3 mm. In an embodiment, the first integrated circuit package 200 may comprise a first heat spreader 230, and the second integrated circuit package may comprise a second heat spreader 230, wherein a difference in height between the first heat spreader 230 and the second heat spreader 230 is up to 3.5 mm. In some embodiments, the difference in height between the first heat spreader 230 and the second heat spreader 230 is greater than 3 mm. In an embodiment, a distance D2 (also referred to as the working distance of the AOI apparatus 20) between a front surface of the lens housing 305 and a top surface of the integrated circuit package 200 being inspected at the point where the integrated circuit package 200 is completely in focus is equal to or greater than 250 mm. Further, in an embodiment, the lens 304 may have a magnification (or ratio of image distance D3 to object distance D4) that is equal to or greater than 0.4. The integrated circuit package 200 to be inspected may be supported on a support boat or carrier 310 that is on a movable stage 311. In an embodiment, a height H3 between the lens 304 and a top surface of the support boat 310 may be in a range from 250 mm to 350 mm.

Advantages can be achieved as a result of the AOI apparatus 20 comprising the lens 304 having an aperture with an f-stop number that is equal to or greater than 8. In addition, the lens 304 has a magnification that is equal to or greater than 0.4. These advantages include the AOI apparatus 20 having a greater working distance D2 that is equal to or greater than 250 mm, and a depth of field 312 with a larger depth D1 which allows for different integrated circuit packages 200 having a difference in height of up to 3.5 mm to be sequentially inspected and still remain in focus without having to adjust the vertical height (e.g., the z-direction) of the lens 304, the CCD camera 302 or the movable stage 311. Further, edges of features of the integrated circuit package 200 can be detected much easier due to better image focus and quality. The removal of the need to adjust the height of the lens 304 or the CCD camera 302 in order to sequentially inspect different integrated circuit packages 200 that have different heights leads to increased throughput and higher manufacturing efficiency.

Figures 12C, 12D:
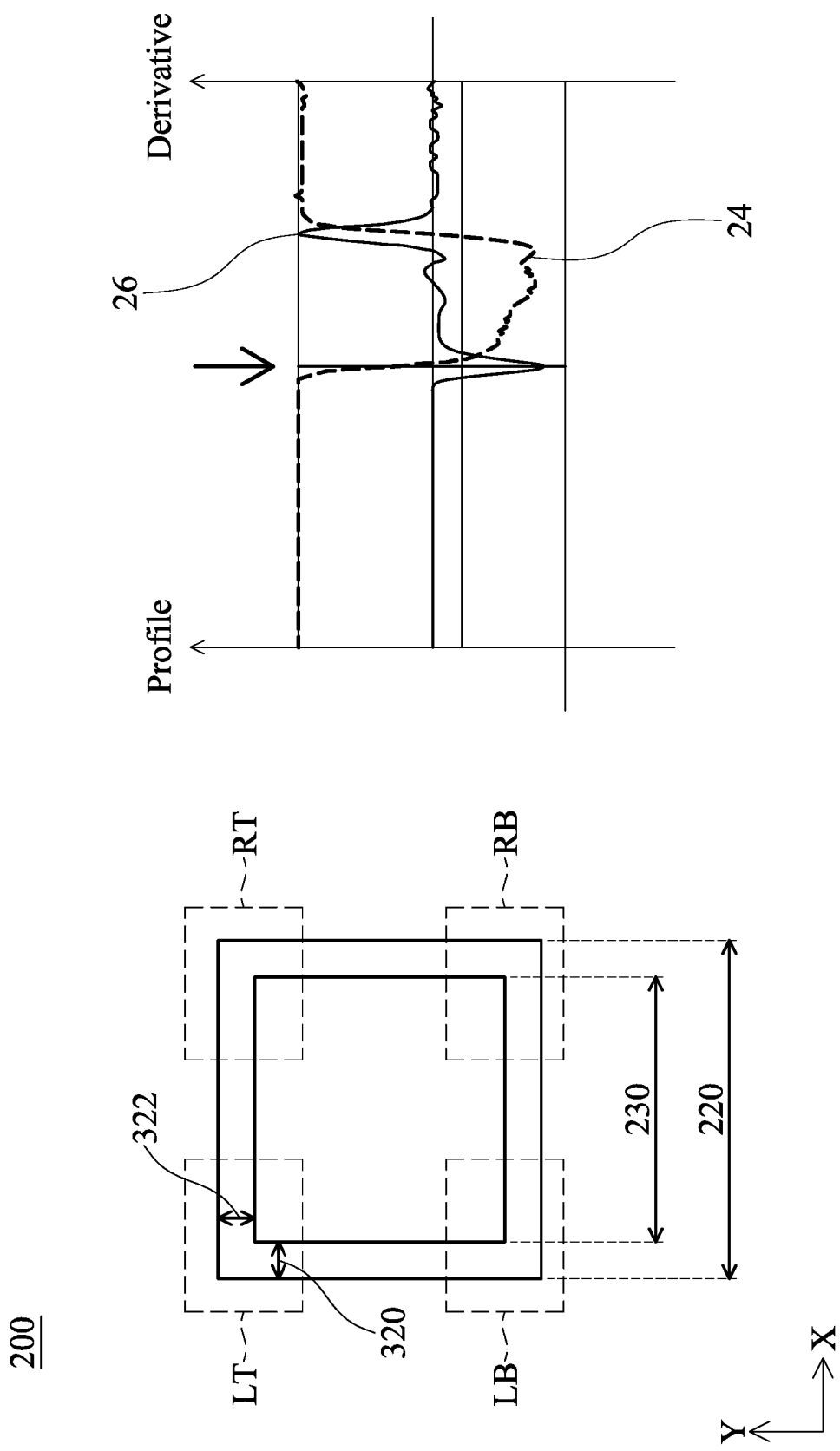
FIG. 12C illustrates a top-down view of an integrated circuit package during the inspection process.
FIG. 12D illustrates traces generated by an edge detection method during the inspection process to detect edges of features an integrated circuit package.

FIG. 12B illustrates a flowchart diagram for the inspection process 301 performed by the AOI system 300 that is used to inspect the integrated circuit package 200. FIG. 12C illustrates a top-down view of the integrated circuit package 200 during the inspection process 301. FIG. 12D illustrates traces generated by an edge detection method during the inspection process 301 to detect edges of the heat spreader 230. A controller 318 is used to adjust a position of the movable stage 311 (e.g., in the x-direction and the y-direction) so as to place a point of interest of the integrated circuit package 200 under illumination using the illuminating apparatus of the AOI apparatus 20 described above. The point of interest may be for example, one of the corners of the integrated circuit package 200 (e.g., top left corner (LT), top right corner (RT), bottom left corner (LB), or bottom right corner (RB) as shown in FIG. 12C). The lens 304 captures the image of the point of interest and presents it to the CCD camera 302 image sensor in the form of light. The image sensor converts the light into a digital image.

In the flowchart block 312, the digital image is sent to a processing unit (e.g., a computer) for analysis. In flowchart block 314, the processing unit performs an image processing process to review the digital image and extract required information regarding the orientation and alignment of the heat spreader 230 with regards to the underlying package substrate 220. For example, if the point of interest being inspected is the top left corner (LT) of the integrated circuit package 200, a digital image of the top left corner (LT) in FIG. 12C may be sent to the processing unit (e.g., the computer) where an image processing process is performed and information extracted and compared to pre-existing template images of a correctly oriented and aligned heat spreader 230 with regards to the underlying package substrate 220. In an embodiment, the image processing process performed in flowchart block 314 may be used to detect edges of the heat spreader 230 that is on the integrated circuit package 200. This can be done by obtaining a derivative of the intensity value of a profile line scan between two points of the digital image, and of the derivative which coincide with edges of the heat spreader 230. For example, FIG. 12D illustrates traces generated by the image processing process of flowchart block 314 during the inspection process 301 to detect edges of the heat spreader 230. A trace 24 describes a profile line scan between two points of a digital image of a point of interest (e.g., top left corner (LT) of the integrated circuit package 200. The digital image is obtained using the AOI apparatus 20 as described in FIG. 12B. A trace 26 describes the derivative of the intensity values of the profile line scan, and points having the largest positive and negative amplitude indicate positions of the edges of the heat spreader 230. The positive and negative values represent differences in the direction of intensity of the profile line scan, such as white to black or black to white. Because of the larger depth of field 312, edges of the integrated circuit packages 200 that have different heights can still remain in good focus which allows for larger positive and negative peak values or amplitudes. In this way, a much more stable and accurate edge detection is achieved. In this way, a spacing 320 (shown in FIG. 12C) in the x-direction between an outer edge of the heat spreader 230 and an outer edge of the package substrate 220 is calculated to determine any heat spreader 230 offset in the x-direction, and a spacing 322 (shown in FIG. 12C) in the y-direction between an outer edge of the heat spreader 230 and an outer edge of the package substrate 220 is calculated to determine any heat spreader 230 offset in the y-direction. In an embodiment, this process to determine the heat spreader 230 offsets in the x-direction and the y-direction is repeated for one or more of the other corners of the integrated circuit package 200 (e.g., top right corner (RT), bottom left corner (LB), or bottom right corner (RB) that are shown in FIG. 12C). The peak analysis of image threshold is larger and more stable based on this inspection.

In flowchart block 316, the resulting data is classified as to whether the orientation and alignment of the heat spreader 230 with regards to the underlying package substrate 220 is within specification. If the orientation and alignment of the heat spreader 230 with regards to the underlying package substrate 220 is not within specification, the heat spreader 230 is removed from the package substrate 220, and the process steps described in FIG. 11A are repeated (e.g., reworked) to dispense adhesive material 229 on the package substrate 220, apply TIM 232 to the top of the package component 210 and place heat spreader 230 on the package substrate 220. If the orientation and alignment of the heat spreader 230 with regards to the underlying package substrate 220 is within specification, further processing steps are performed on the integrated circuit package 200 as shown in FIG. 13.

Advantages can be achieved as a result of The AOI apparatus 20 comprising the lens 304 having an aperture with an f-stop number that is equal to or greater than 8. In addition, the lens 304 has a magnification that is equal to or greater than 0.4. These advantages include the AOI apparatus 20 having a greater working distance D2 that is equal to or greater than 250 mm, and a depth of field 312 with a larger depth D1 which allows for different integrated circuit packages 200 having different heights to be sequentially inspected (e.g., using the inspection process 301) and still remain in focus without having to adjust the vertical height (e.g., the z-direction) of the of the lens 304, the CCD camera 302 or the movable stage 311. Because different integrated circuit packages 200 that have different heights can still remain in good focus, edges of features (e.g., the heat spreader 230) of the integrated circuit package 200 can be detected much more easily and accurately using the image processing process performed in flowchart block 314 of the inspection process 301. This leads to a reduction in the number of false heat spreader 230 offset alarms during the inspection process 301 as edges of features of the integrated circuit packages 200 are easier to detect. The reduction in false heat spreader 230 offset alarms leads to increased throughput and higher manufacturing efficiency.

Figure 13:
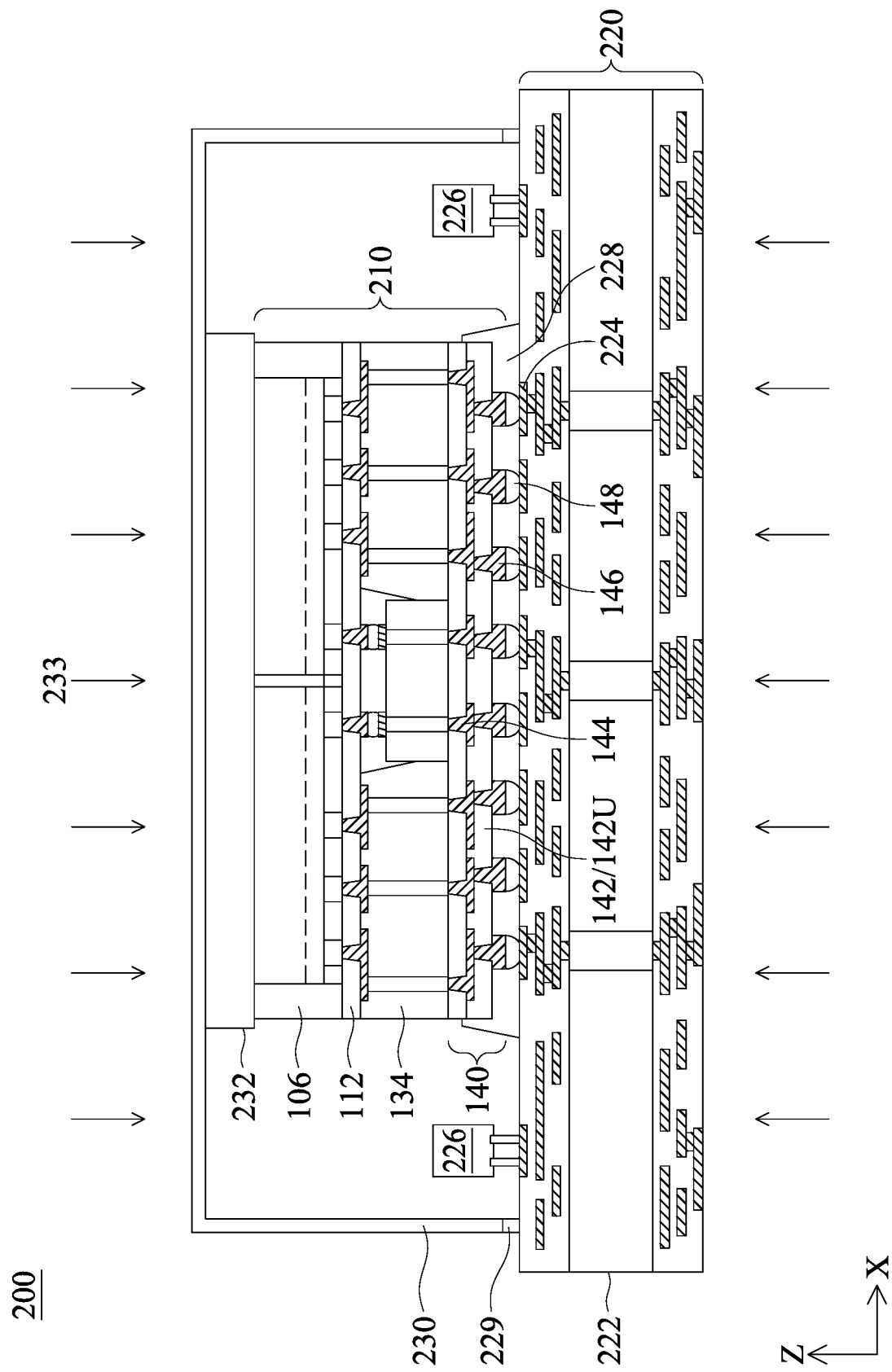
FIG. 13 illustrates a process that applies pressure and heat to a top surface and a bottom surface of an integrated circuit package substrate.

In FIG. 13, a process 233 is performed in which the integrated circuit package 200 is placed in a clamp apparatus that applies pressure and heat on a top surface of the heat spreader 230 and a bottom surface of the package substrate 220 in order to press and hold the heat spreader 230 to the package substrate 220 in a fixed position such that movement of the heat spreader 230 relative to the package substrate 220 is restricted. During the process 233, a temperature of the clamp apparatus may be in a range from 60° C. to 170° C. During the process 233, the adhesive material 229 will be flattened and a thermal effect takes place in the adhesive material 229 that can help reduce warpage of the package substrate 220 and further to prolong the life of the integrated circuit package 200. After the process 233 is performed, a suitable curing process may be performed that cures the adhesive material 229 to enable secure attachment of the heat spreader 230 to the package substrate 220.

After the process 233 is performed, the inspection process 301 is performed again by the AOI system 300 to inspect the integrated circuit package 200 and verify that the orientation and alignment of the heat spreader 230 with regards to the underlying package substrate 220 is within specification. If the orientation and alignment of the heat spreader 230 with regards to the underlying package substrate 220 is not within specification, the heat spreader 230 is removed from the package substrate 220, and the process steps described in FIGS. 11A through 13 are repeated. Although the AOI system 300 is described as being used to inspect an integrated circuit package 200 that comprises the heat spreader 230, the AOI system 300 may be used to inspect any aspect or feature of any package or structure during manufacture or assembly thereof.

FIGS. 14-20 are views of intermediate stages in the manufacturing of integrated circuit packages 200, in accordance with some other embodiments. Unless specified otherwise, like reference numerals in this embodiment (and subsequently discussed embodiments) represent like components in the embodiments shown in FIGS. 1 through 11B formed by like processes. Accordingly, the process steps and applicable materials may not be repeated herein. FIGS. 14-18 are cross-sectional views of a process for forming package components 210 which include interposers, such as package components for chip-on-wafer-on-substrate (CoWoS) devices. The package components 210 may be chip-on-wafer (CoW) package components.

Figure 14:
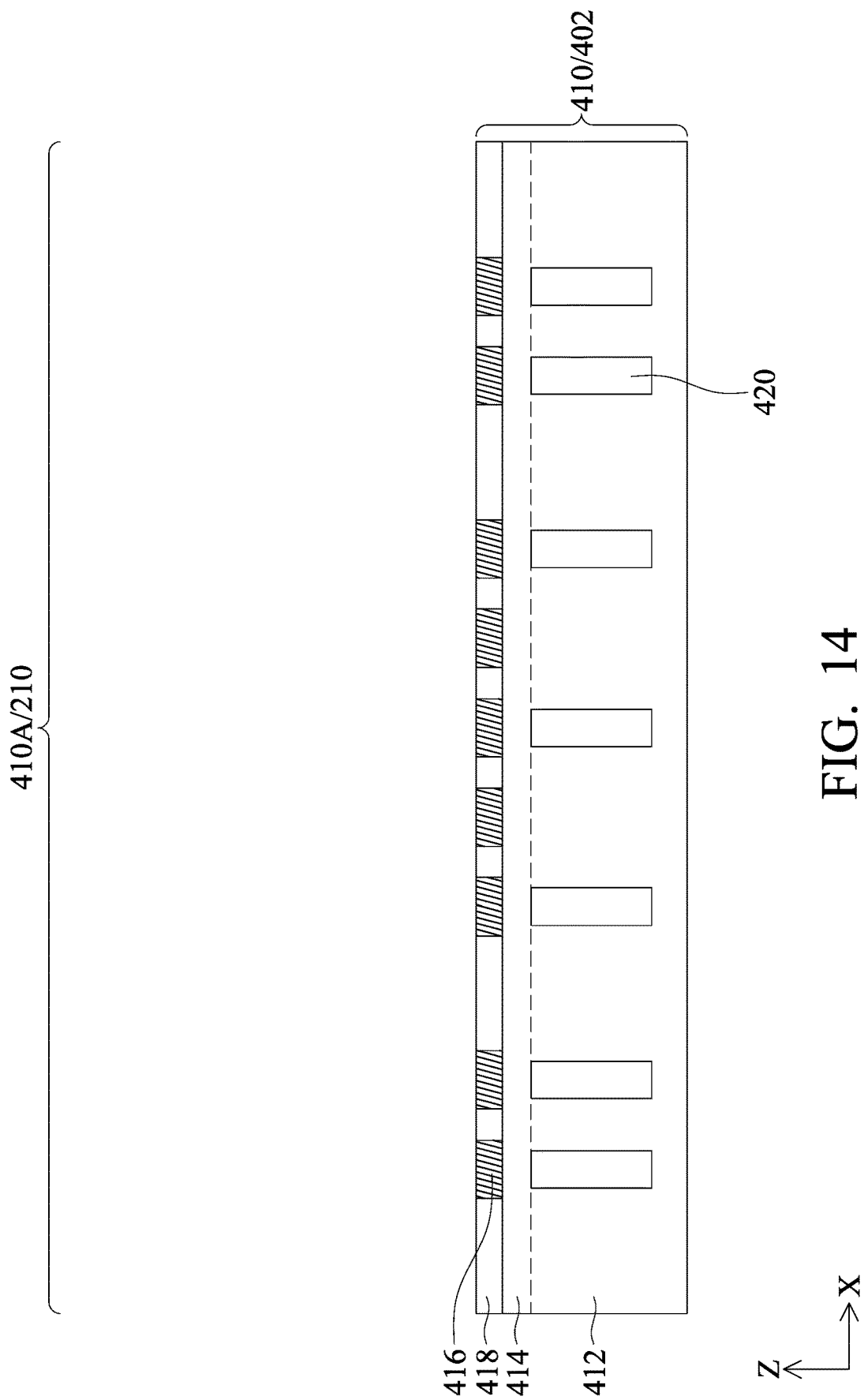
FIGS. 14-18 are views of intermediate stages in the manufacturing of integrated circuit packages, in accordance with some other embodiments.

In FIG. 14, a wafer 410 is obtained or formed. The wafer 410 comprises devices in a package region 410A, which will be singulated in subsequent processing to be included in the package component 210. The devices in the wafer 410 may be interposers, integrated circuit dies, or the like. In some embodiments, interposers 402 are formed in the wafer 410, which include a substrate 412, an interconnect structure 414, and conductive vias 420.

The substrate 412 may be a bulk semiconductor substrate, a semiconductor-on-insulator (SOI) substrate, a multi-layered semiconductor substrate, or the like. The substrate 412 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 412 may be doped or undoped. In embodiments where interposers are formed in the wafer 410, the substrate 412 generally does not include active devices therein, although the interposers may include passive devices formed in and/or on a front surface (e.g., the surface facing upward in FIG. 14) of the substrate 412. In embodiments where integrated circuit devices are formed in the wafer 410, active devices such as transistors, capacitors, resistors, diodes, and the like, may be formed in and/or on the front surface of the substrate 412.

The interconnect structure 414 is over the front surface of the substrate 412, and is used to electrically connect the devices (if any) of the substrate 412. The interconnect structure 414 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 414 may be formed by a damascene process, such as a single damascene process, a dual damascene process, or the like.

In some embodiments, die connectors 416 and a dielectric layer 418 are at the front-side of the wafer 410. Specifically, the wafer 410 may include die connectors 416 and a dielectric layer 418 that are similar to those of the integrated circuit die 50 described for FIG. 1. For example, the die connectors 416 and the dielectric layer 418 may be part of an upper metallization layer of the interconnect structure 414.

The conductive vias 420 extend into the interconnect structure 414 and/or the substrate 412. The conductive vias 420 are electrically connected to metallization layer(s) of the interconnect structure 414. The conductive vias 420 are also sometimes referred to as TSVs. As an example to form the conductive vias 420, recesses can be formed in the interconnect structure 414 and/or the substrate 412 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 414 or the substrate 412 by, for example, a CMP. Remaining portions of the barrier layer and conductive material form the conductive vias 420.

Figure 15:
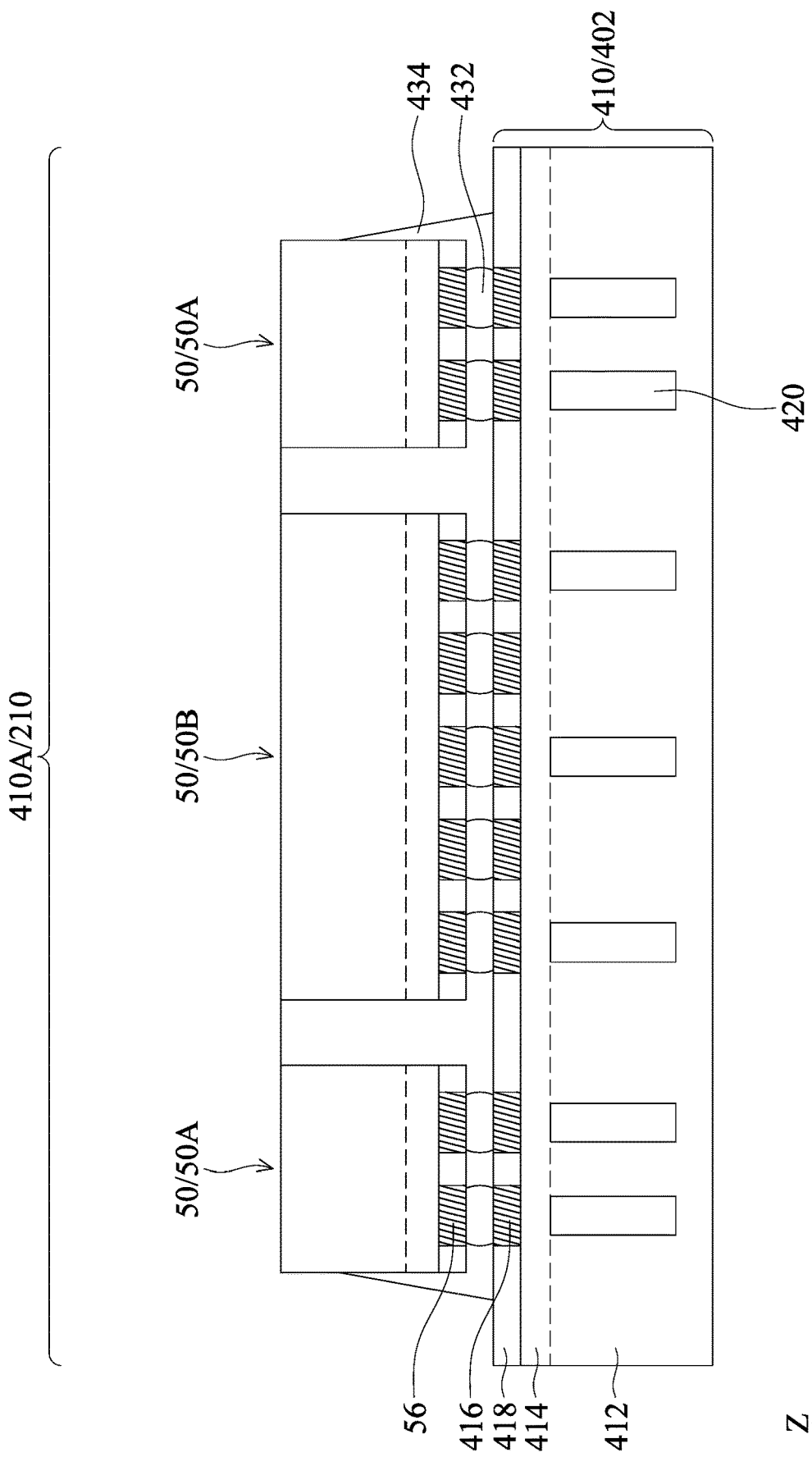

In FIG. 15, integrated circuit dies 50 (e.g., a first integrated circuit die 50A and a plurality of second integrated circuit dies 50B) are attached to the wafer 410. In the embodiment shown, multiple integrated circuit dies 50 are placed adjacent one another, including the first integrated circuit die 50A and the second integrated circuit dies 50B, where the first integrated circuit die 50A is between the second integrated circuit dies 50B. In some embodiments, the first integrated circuit die 50A is a logic device, such as a CPU, GPU, or the like, and the second integrated circuit dies 50B are memory devices, such as DRAM dies, HMC modules, HBM modules, or the like. In some embodiments, the first integrated circuit die 50A is the same type of device (e.g., SoCs) as the second integrated circuit dies 50B.

In the illustrated embodiment, the integrated circuit dies 50 are attached to the wafer 410 with solder bonds, such as with conductive connectors 432. The integrated circuit dies 50 may be placed on the interconnect structure 414 using, e.g., a pick-and-place tool. The conductive connectors 432 may be formed of a conductive material that is reflowable, such as solder, copper, aluminum, gold, nickel, silver, palladium, tin, the like, or a combination thereof. In some embodiments, the conductive connectors 432 are formed by initially forming a layer of solder through methods such as evaporation, electroplating, printing, solder transfer, ball placement, or the like. Once a layer of solder has been formed on the structure, a reflow may be performed in order to shape the conductive connectors 432 into desired bump shapes. Attaching the integrated circuit dies 50 to the wafer 410 may include placing the integrated circuit dies 50 on the wafer 410 and reflowing the conductive connectors 432. The conductive connectors 432 form joints between corresponding die connectors 416 of the wafer 410 and die connectors 56 the integrated circuit dies 50, electrically connecting the interposer 402 to the integrated circuit dies 50.

An underfill 434 may be formed around the conductive connectors 432, and between the wafer 410 and the integrated circuit dies 50. The underfill 434 may reduce stress and protect the joints resulting from the reflowing of the conductive connectors 432. The underfill 434 may be formed of an underfill material such as a molding compound, epoxy, or the like. The underfill 434 may be formed by a capillary flow process after the integrated circuit dies 50 are attached to the wafer 410, or may be formed by a suitable deposition method before the integrated circuit dies 50 are attached to the wafer 410. The underfill 434 may be applied in liquid or semi-liquid form and then subsequently cured.

In other embodiments (not separately illustrated), the integrated circuit dies 50 are attached to the wafer 410 with direct bonds. For example, hybrid bonding, fusion bonding, dielectric bonding, metal bonding, or the like may be used to directly bond corresponding dielectric layers 58, 418 and/or die connectors 56, 416 of the integrated circuit dies 50 and the wafer 410 without the use of adhesive or solder. The underfill 434 may be omitted when direct bonding is used. Further, a mix of bonding techniques could be used, e.g., some integrated circuit dies 50 could be attached to the wafer 410 by solder bonds, and other integrated circuit dies 50 could be attached to the wafer 410 by direct bonds.

Figure 16:
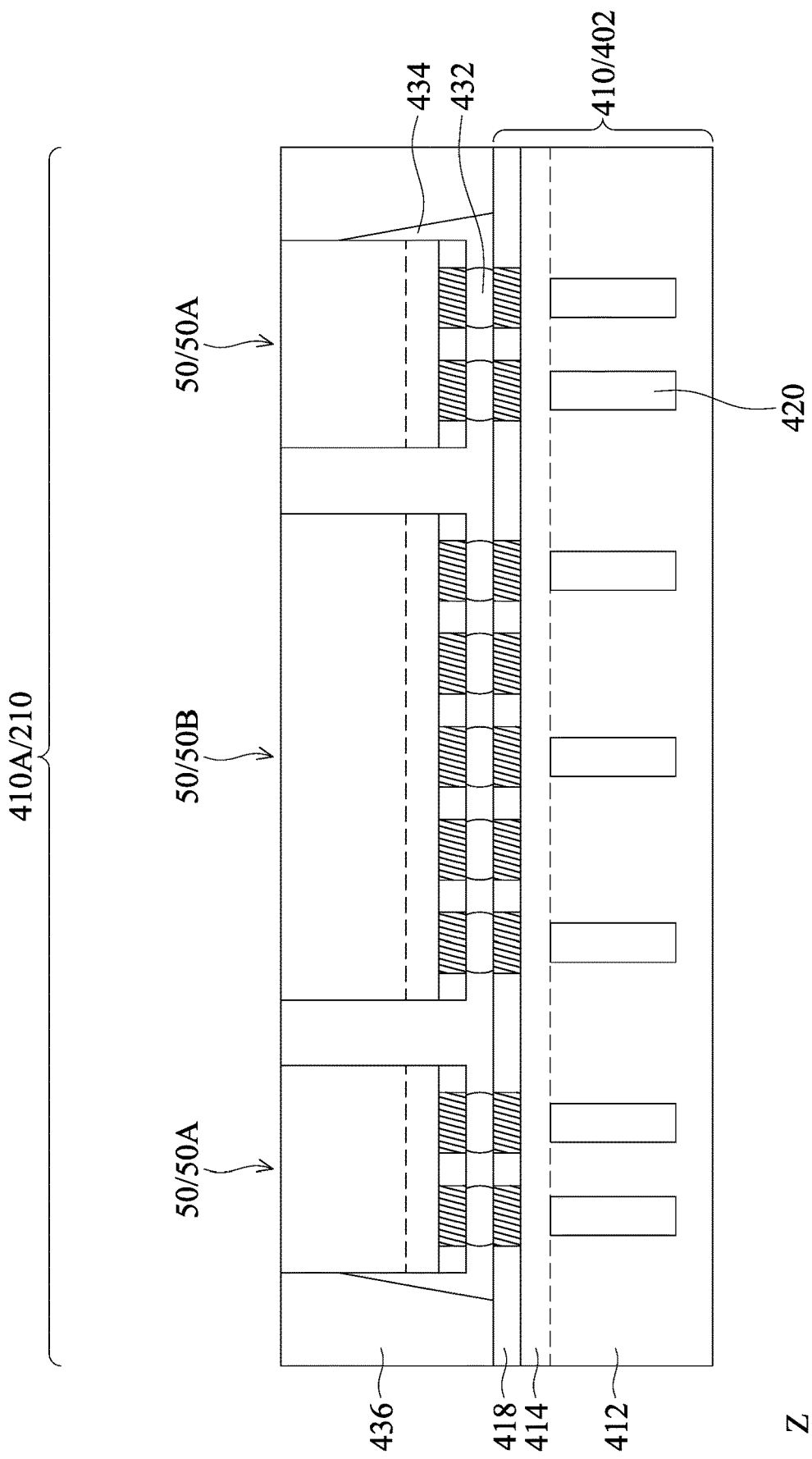

In FIG. 16, an encapsulant 436 is formed on and around the integrated circuit dies 50. After formation, the encapsulant 436 encapsulates the integrated circuit dies 50, and the underfill 434 (if present) or the conductive connectors 432. The encapsulant 436 may be a molding compound, epoxy, or the like. The encapsulant 436 may be applied by compression molding, transfer molding, or the like, and is formed over the wafer 410 such that the integrated circuit dies 50 are buried or covered. The encapsulant 436 may be applied in liquid or semi-liquid form and then subsequently cured. The encapsulant 436 may be thinned to expose the integrated circuit dies 50. The thinning process may be a grinding process, a chemical-mechanical polish (CMP), an etch-back, combinations thereof, or the like. After the thinning process, the top surfaces of the integrated circuit dies 50 and the encapsulant 436 are coplanar (within process variations) such that they are level with one another. The thinning is performed until a desired amount of the integrated circuit dies 50 and/or the encapsulant 436 has been removed.

Figure 17:
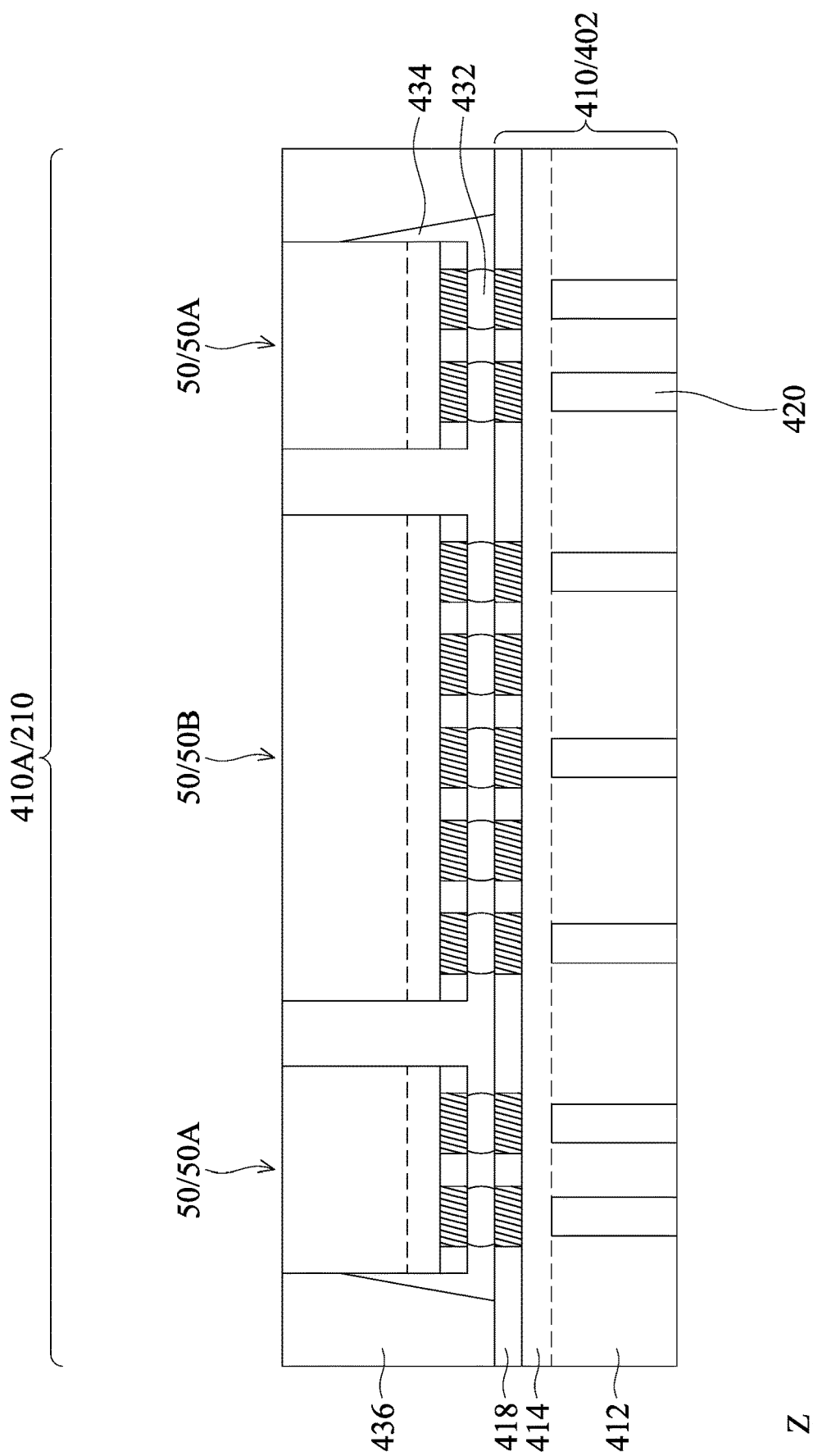

In FIG. 17, the substrate 412 is thinned to expose the conductive vias 420. Exposure of the conductive vias 420 may be accomplished by a thinning process, such as a grinding process, a chemical-mechanical polish (CMP), an etch-back, combinations thereof, or the like. In some embodiments (not separately illustrated), the thinning process for exposing the conductive vias 420 includes a CMP, and the conductive vias 420 protrude at the back-side of the wafer 410 as a result of dishing that occurs during the CMP. In such embodiments, an insulating layer (not separately illustrated) may optionally be formed on the back surface of the substrate 412, surrounding the protruding portions of the conductive vias 420. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 412 is thinned, the exposed surfaces of the conductive vias 420 and the insulating layer (if present) or the substrate 412 are coplanar (within process variations) such that they are level with one another, and are exposed at the back-side of the wafer 410.

Figure 18:
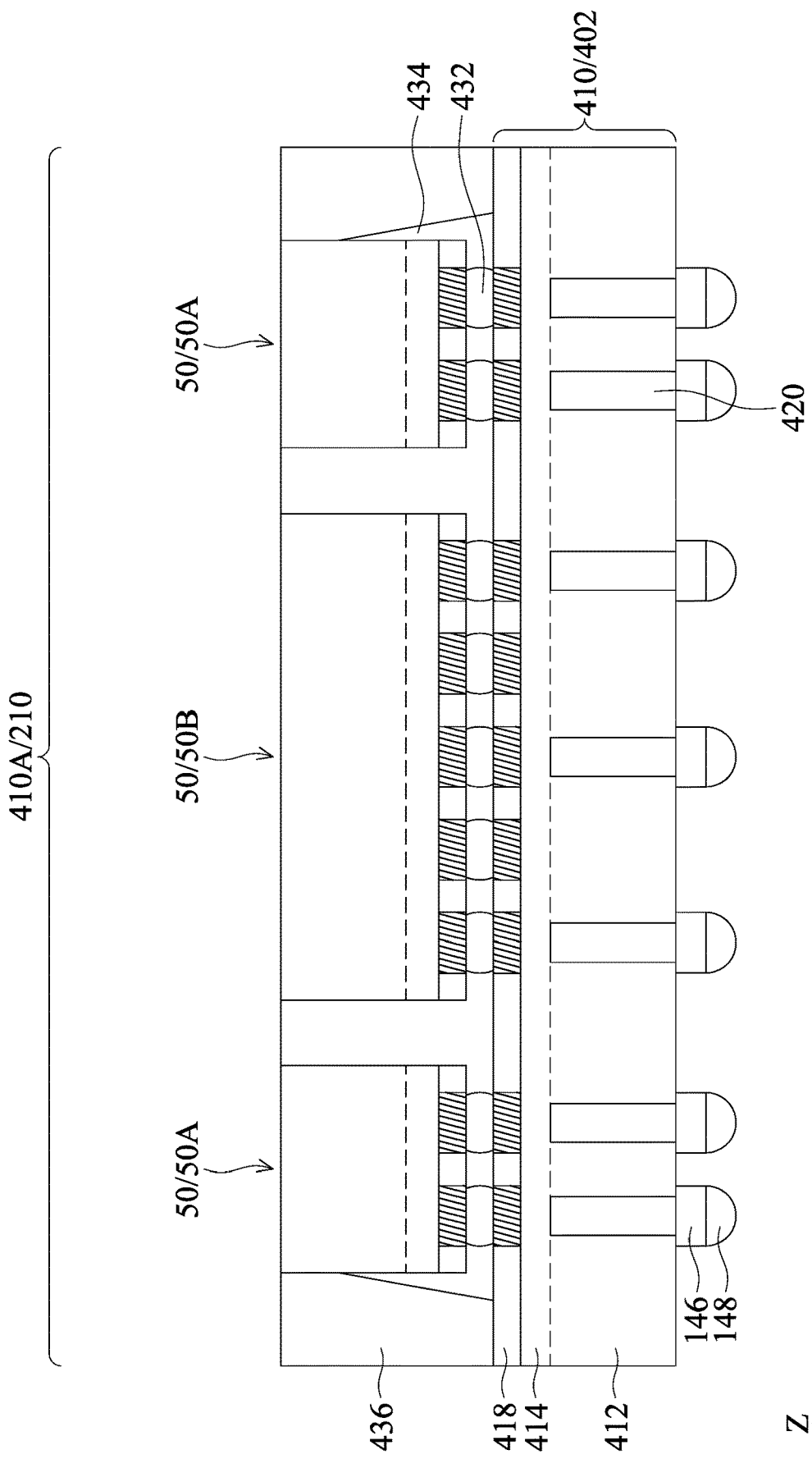

In FIG. 18, UBMs 146 are formed on the exposed surfaces of the conductive vias 420 and the substrate 412. As an example to form the UBMs 146 in this embodiment, a seed layer (not separately illustrated) is formed over the exposed surfaces of the conductive vias 420 and the substrate 412. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 146.

Further, conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Further, a singulation process is performed by cutting along scribe line regions, e.g., around the package region 410A. The singulation process may include sawing, dicing, or the like. For example, the singulation process can include sawing the encapsulant 436, the interconnect structure 414, and the substrate 412. The singulation process singulates the package region 410A from adjacent package regions. The resulting, singulated package component 210 is from the package region 410A. The singulation process forms interposers 402 from the singulated portions of the wafer 410. As a result of the singulation process, the outer sidewalls of the interposer 402 and the encapsulant 436 are laterally coterminous (within process variations).

Figure 19:
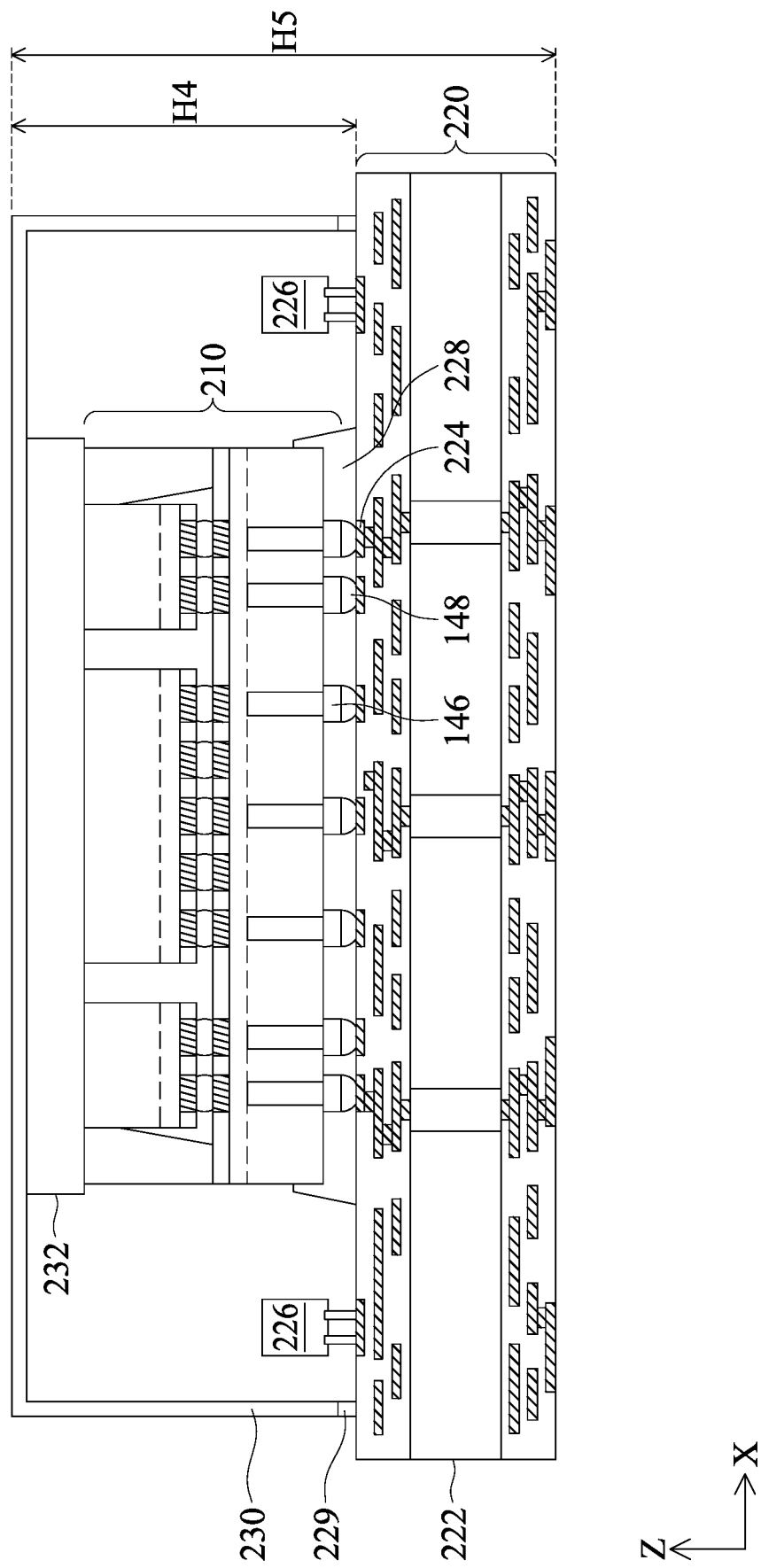
FIG. 19 is a view of an integrated circuit package, in accordance with some other embodiments.
Figure 20:
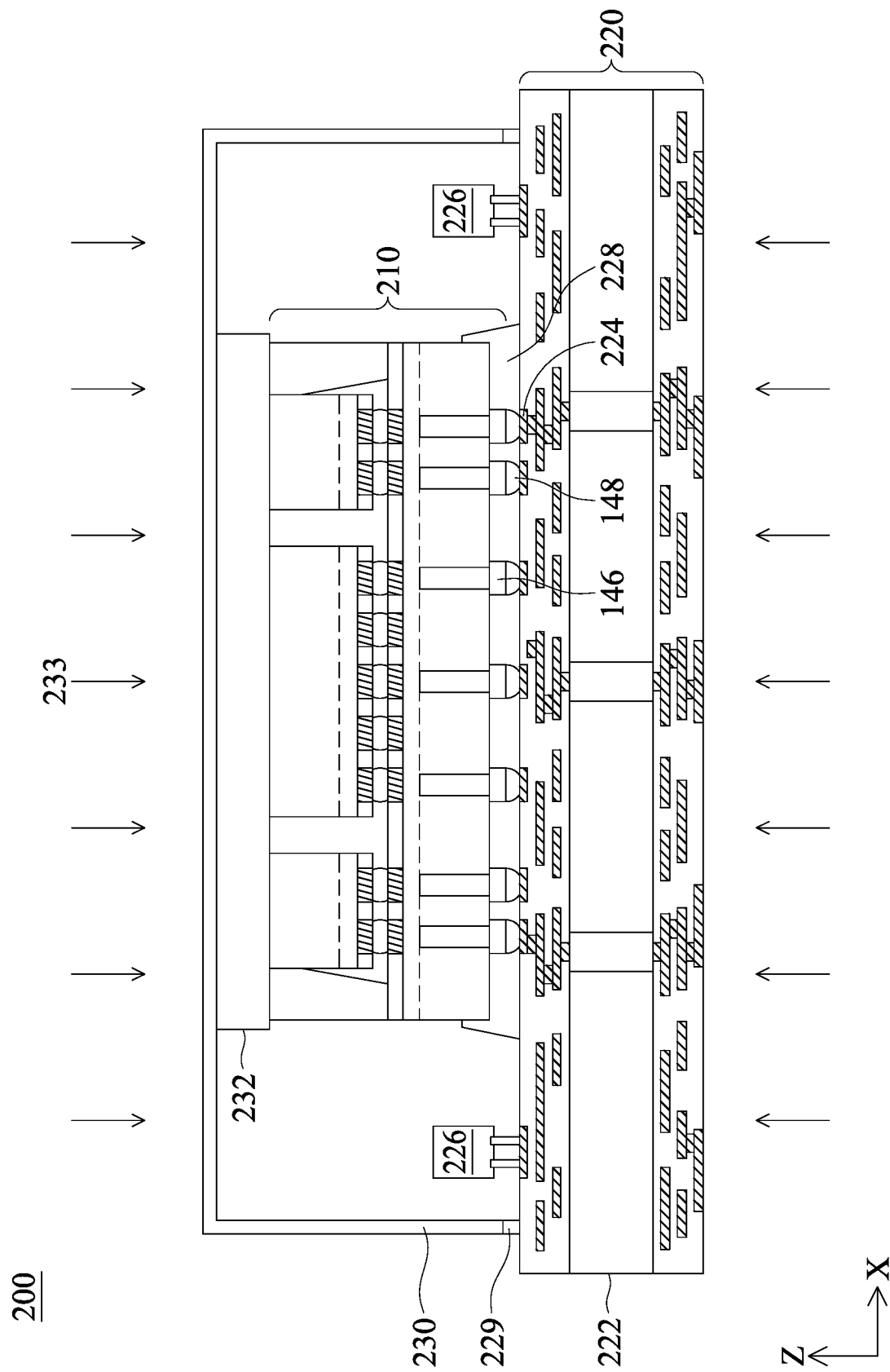
FIG. 20 illustrates a process that applies pressure and heat to a top surface and a bottom surface of an integrated circuit package substrate.

FIGS. 19-20 illustrate various additional steps in the manufacturing of embodiment packages. The package components 210 will be attached to package substrates 220 (see FIG. 20), thus completing formation of the integrated circuit packages 200. A single package component 210, a single package substrate 220, and a single integrated circuit package 200 are illustrated. It should be appreciated that multiple package components can be simultaneously processed to form multiple integrated circuit packages 200.

In FIG. 19, the package component 210 is attached to the package substrate 220 using the conductive connectors 148 in a similar manner as that described previously in FIG. 10. The package substrate 220 includes the substrate core 222 (described previously in FIG. 10. In some embodiments, the underfill 228 (described previously in FIG. 10) is formed between the package component 210 and the package substrate 220, surrounding the conductive connectors 148.

After the package component 210 is attached to the package substrate 220, the adhesive material 229 (described previously in FIG. 11A) is dispensed on the package substrate 220 in a similar manner as was described in FIG. 11A.

Following application of the adhesive material 229 to the package substrate 220, the thermal interface material (TIM) 232 (described previously in FIG. 11A) is applied to the top of the package component 210 in a similar manner as was described in FIG. 11A.

Further referring to FIG. 19, the heat spreader 230 (described previously in FIG. 11A) is placed on the package substrate 220. In an embodiment, a height H4 of the heat spreader 230 may be in a range from 0.3 mm to 3.8 mm. In an embodiment, a height H5 of the integrated circuit package 200 may be in a range from 2.5 mm to 6 mm. The heat spreader 230 is thermally coupled to the back-side surface of the package component 210 through the TIM 232, and coupled to the package substrate 220 through the adhesive material 229.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

After the heat spreader 230 is placed on the package substrate 220, the inspection process 301 (described previously in FIGS. 12A through 12D) is performed to inspect the integrated circuit package 200 and verify that the heat spreader 230 is correctly placed and aligned with regards to the underlying package substrate 220. If the orientation and alignment of the heat spreader 230 with regards to the underlying package substrate 220 is not within specification, the heat spreader 230 is removed from the package substrate 220, and the adhesive material 229 (described previously in FIG. 11A) is dispensed on the package substrate 220 in a similar manner as was described in FIG. 19. Following application of the adhesive material 229 to the package substrate 220, the thermal interface material (TIM) 232 (described previously in FIG. 11A) is applied to the top of the package component 210 in a similar manner as was described in FIG. 19. If the orientation and alignment of the heat spreader 230 with regards to the underlying package substrate 220 is within specification, further processing steps are performed on the integrated circuit package 200 as shown in FIG. 20.

In FIG. 20, the process 233 is performed in which the integrated circuit package 200 is placed in a clamp apparatus that applies pressure and heat to a top surface of the heat spreader 230 and a bottom surface of the package substrate 220 in order to press and hold the heat spreader 230 to the package substrate 220 in a fixed position such that movement of the heat spreader 230 relative to the package substrate 220 is restricted. During the process 233, a temperature of the clamp apparatus may be in a range from 60° C. to 170° C. During the process 233, the adhesive material 229 will be flattened and a thermal effect takes place in the adhesive material 229 that can help reduce warpage of the package substrate 220 and further to prolong the life of the integrated circuit package 200. After the process 233 is performed, a suitable curing process may be performed that cures the adhesive material 229 to enable secure attachment of the heat spreader 230 to the package substrate 220.

Advantages can be achieved as a result of the AOI apparatus 20 comprising the lens 304 having an aperture with an f-stop number that is equal to or greater than 8. In addition, the lens 304 has a magnification that is equal to or greater than 0.4. These advantages include the AOI apparatus 20 having a greater working distance D2 that is equal to or greater than 250 mm, and a depth of field 312 with a larger depth D1 which allows for different integrated circuit packages 200 having a difference of heights of up to 3.5 mm to be sequentially inspected (e.g., using the inspection process 301) and still remain in focus without having to adjust the vertical height (e.g., the z-direction) of the of the lens 304, the CCD camera 302 or the movable stage 311. In some embodiments, the AOI apparatus 20 allows for different integrated circuit packages 200 having a difference of heights greater than 3 mm to be sequentially inspected (e.g., using the inspection process 301) and still remain in focus without having to adjust the vertical height (e.g., the z-direction) of the of the lens 304, the CCD camera 302 or the movable stage 311. The removal of the need to adjust the height of the lens 304, the CCD camera 302 or the movable stage 311 in order to sequentially inspect different integrated circuit packages 200 that have a difference in heights of up to 3.5 mm leads to increased throughput and higher manufacturing efficiency. In addition, because different integrated circuit packages 200 that have different heights can still remain in good focus during the inspection process 301, edges of features (e.g., the heat spreader 230) of the integrated circuit package 200 can be detected much more easily and accurately using the image processing process performed in flowchart block 314 of the inspection process 301. This leads to a reduction in the number of false heat spreader 230 offset alarms during the inspection process 301 as edges of features of the integrated circuit packages 200 are easier to detect. The reduction in false heat spreader 230 offset alarms leads to increased throughput and higher manufacturing efficiency.

In accordance with an embodiment, a method includes forming a package component, the package component including an integrated circuit die; attaching the package component to a package substrate; placing a heat spreader over the package component and the package substrate to form an integrated circuit package, where a height of the integrated circuit package is in a range from 2.5 mm to 6 mm; and performing a first automatic optical inspection (AOI) process on the integrated circuit package using an AOI apparatus to determine if the orientation and alignment of the heat spreader with regards to the package substrate is within specification, where the AOI apparatus includes a lens that has a maximum depth of field that is greater than the height of the integrated circuit package, and where during the first AOI process the depth of field encompasses an entirety of the height of the integrated circuit package. In an embodiment, the AOI apparatus includes a charge coupled device (CCD) camera, and where during performing the first AOI process vertical positions of the CCD camera and the lens are unchanged. In an embodiment, the AOI apparatus has a working distance that is equal to or greater than 250 mm. In an embodiment, the method further includes applying heat and pressure to the integrated circuit package using a clamp apparatus to press and hold the heat spreader to the package substrate; and performing a second AOI process using the AOI apparatus to determine if the orientation and alignment of the heat spreader with regards to the package substrate is within specification. In an embodiment, the lens has an aperture with an f-stop number that is equal to or greater than 8, and where the maximum depth of field is equal to 6.2 mm. In an embodiment, the lens has a magnification that is equal to or greater than 0.4.

In accordance with an embodiment, a method includes performing a first automatic optical inspection (AOI) process on a first integrated circuit package component using an AOI apparatus to determine if the orientation and alignment of the first integrated circuit package component is within specification, where the AOI apparatus includes a lens and a charge coupled device (CCD) camera; and performing a second AOI process on a second integrated circuit package component using the AOI apparatus to determine if the orientation and alignment of the second integrated circuit package component is within specification, where a difference in height between the first integrated circuit package component and the second integrated circuit package component is greater than 3 mm and where first vertical positions of the CCD camera and the lens during the first AOI process is the same as second vertical positions of the CCD camera and the lens during the second AOI process. In an embodiment, the lens has a depth of field that is equal to or greater than 4 mm. In an embodiment, the AOI apparatus has a working distance that is equal to or greater than 250 mm. In an embodiment, each of the first integrated circuit package component and the second integrated circuit package component includes a thermal lid or thermal ring, and the difference in height between the first integrated circuit package component and the second integrated circuit package component is 3.5 mm. In an embodiment, the lens has a depth of field that encompasses an entirety of the height of the first integrated circuit package component and an entirety of the height of the second integrated circuit package component. In an embodiment, an aperture of the lens has an f-stop number that is equal to or greater than 8.

In accordance with an embodiment, a method includes attaching a first package component and a second package component to a first package substrate and a second package substrate, respectively; placing a first heat spreader over the first package component and the first package substrate to form a first integrated circuit package; placing a second heat spreader over the second package component and the second package substrate to form a second integrated circuit package; performing a first automatic optical inspection (AOI) process on the first integrated circuit package using an AOI apparatus, where the AOI apparatus includes a lens and a charge coupled device (CCD) camera, where during the first AOI process a top surface of the first heat spreader is in focus; and where during the first AOI process the CCD camera and the lens are at fixed vertical heights; and performing a second AOI process on the second integrated circuit package using the AOI apparatus, where during the second AOI process a top surface of the second heat spreader is in focus, where a difference in height between the top surface of the first heat spreader and the top surface of the second heat spreader is 3.5 mm, and where during the second AOI process the CCD camera and the lens are at the same fixed vertical heights as the fixed vertical heights of the first AOI process. In an embodiment, a depth of field of the lens is equal to or greater than 4 mm. In an embodiment, a magnification of the lens is equal to or greater than 0.4. In an embodiment, the method further includes applying heat and pressure to the first integrated circuit package using a clamp apparatus to press and hold the first heat spreader to the first package substrate; and performing a third AOI process on the first integrated circuit package using the AOI apparatus, where during the third AOI process the top surface of the first heat spreader is in focus, and where during the third AOI process the CCD camera and the lens are at the same fixed vertical heights as the fixed vertical heights of the first AOI process. In an embodiment, the method further includes applying heat and pressure to the second integrated circuit package using the clamp apparatus to press and hold the second heat spreader to the second package substrate; and performing a fourth AOI process on the second integrated circuit package using the AOI apparatus, where during the fourth AOI process the top surface of the second heat spreader is in focus, and where during the fourth AOI process the CCD camera and the lens are at the same fixed vertical heights as the fixed vertical heights of the first AOI process. In an embodiment, the lens has an aperture with an f-stop number that is equal to or greater than 8. In an embodiment, the AOI apparatus further includes a support boat that supports the first integrated circuit package and the second integrated circuit package during the first AOI process and the second AOI process, respectively, where a height between the lens and a top surface of the support boat during the first AOI process and the second AOI process is in a range from 250 mm to 350 mm. In an embodiment, a working distance of the AOI apparatus is equal to or greater than 250 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a package component, the package component comprising an integrated circuit die;
    attaching the package component to a package substrate;
    placing a heat spreader over the package component and the package substrate to form an integrated circuit package,
        wherein a height of the integrated circuit package is in a range from 2.5 mm to 6 mm; and
    performing a first automatic optical inspection (AOI) process on the integrated circuit package using an AOI apparatus to compare the orientation and alignment of the heat spreader with regards to the package substrate, wherein the AOI apparatus comprises a lens that has a maximum depth of field that is greater than the height of the integrated circuit package, and wherein during the first AOI process the depth of field encompasses an entirety of the height of the integrated circuit package.

2. The method of claim 1, wherein the AOI apparatus comprises a charge coupled device (CCD) camera, and wherein during performing the first AOI process vertical positions of the CCD camera and the lens are unchanged.

3. The method of claim 1, wherein the AOI apparatus has a working distance that is equal to or greater than 250 mm.

4. The method of claim 1 further comprising:
    applying heat and pressure to the integrated circuit package using a clamp apparatus to press and hold the heat spreader to the package substrate; and
    performing a second AOI process using the AOI apparatus to determine if the orientation and alignment of the heat spreader with regards to the package substrate is within specification.

5. The method of claim 1, wherein the lens has an aperture with an f-stop number that is equal to or greater than 8, and wherein the maximum depth of field is equal to 6.2 mm.

6. The method of claim 5, wherein the lens has a magnification that is equal to or greater than 0.4.

7. A method comprising:
performing a first automatic optical inspection (AOI) process on a first integrated circuit package component using an AOI apparatus to determine an orientation and alignment of the first integrated circuit package component, wherein the AOI apparatus comprises a lens and a charge coupled device (CCD) camera; and
performing a second AOI process on a second integrated circuit package component using the AOI apparatus to determine an orientation and alignment of the second integrated circuit package component, wherein a difference in height between the first integrated circuit package component and the second integrated circuit package component is greater than 3 mm and wherein first vertical positions of the CCD camera and the lens during the first AOI process is the same as second vertical positions of the CCD camera and the lens during the second AOI process.

8. The method of claim 7, wherein the lens has a depth of field that is equal to or greater than 4 mm.

9. The method of claim 7, wherein the AOI apparatus has a working distance that is equal to or greater than 250 mm.

10. The method of claim 7, wherein each of the first integrated circuit package component and the second integrated circuit package component comprise a thermal lid or thermal ring, and the difference in height between the first integrated circuit package component and the second integrated circuit package component is 3.5 mm.

11. The method of claim 7, wherein the lens has a depth of field that encompasses an entirety of the height of the first integrated circuit package component and an entirety of the height of the second integrated circuit package component.

12. The method of claim 7, wherein an aperture of the lens has an f-stop number that is equal to or greater than 8.

13. A method comprising:
attaching a first package component and a second package component to a first package substrate and a second package substrate, respectively;
placing a first heat spreader over the first package component and the first package substrate to form a first integrated circuit package;
placing a second heat spreader over the second package component and the second package substrate to form a second integrated circuit package;
performing a first automatic optical inspection (AOI) process on the first integrated circuit package using an AOI apparatus, wherein the AOI apparatus comprises a lens and a charge coupled device (CCD) camera, wherein during the first AOI process a top surface of the first heat spreader is in focus; and wherein during the first AOI process the CCD camera and the lens are at fixed vertical heights; and
performing a second AOI process on the second integrated circuit package using the AOI apparatus, wherein during the second AOI process a top surface of the second heat spreader is in focus, wherein a difference in height between the top surface of the first heat spreader and the top surface of the second heat spreader is 3.5 mm, and wherein during the second AOI process the CCD camera and the lens are at the same fixed vertical heights as the fixed vertical heights of the first AOI process.

14. The method of claim 13, wherein a depth of field of the lens is equal to or greater than 4 mm.

15. The method of claim 13, wherein a magnification of the lens is equal to or greater than 0.4.

16. The method of claim 13 further comprising:
applying heat and pressure to the first integrated circuit package using a clamp apparatus to press and hold the first heat spreader to the first package substrate; and
performing a third AOI process on the first integrated circuit package using the AOI apparatus, wherein during the third AOI process the top surface of the first heat spreader is in focus, and wherein during the third AOI process the CCD camera and the lens are at the same fixed vertical heights as the fixed vertical heights of the first AOI process.

17. The method of claim 16 further comprising:
applying heat and pressure to the second integrated circuit package using the clamp apparatus to press and hold the second heat spreader to the second package substrate; and
performing a fourth AOI process on the second integrated circuit package using the AOI apparatus, wherein during the fourth AOI process the top surface of the second heat spreader is in focus, and wherein during the fourth AOI process the CCD camera and the lens are at the same fixed vertical heights as the fixed vertical heights of the first AOI process.

18. The method of claim 13, wherein the lens has an aperture with an f-stop number that is equal to or greater than 8.

19. The method of claim 13, wherein the AOI apparatus further comprises a support boat that supports the first integrated circuit package and the second integrated circuit package during the first AOI process and the second AOI process, respectively, wherein a height between the lens and a top surface of the support boat during the first AOI process and the second AOI process is in a range from 250 mm to 350 mm.

20. The method of claim 13, wherein a working distance of the AOI apparatus is equal to or greater than 250 mm.

* * * * *